(12) United States Patent
Tominaga et al.

(10) Patent No.: US 10,854,639 B2
(45) Date of Patent: Dec. 1, 2020

(54) ACTIVE MATRIX SUBSTRATE, DISPLAY DEVICE, AND METHOD FOR REPAIRING DEFECT OF ACTIVE MATRIX SUBSTRATE

(71) Applicant: SHARP KABUSHIKI KAISHA, Sakai (JP)

(72) Inventors: Masakatsu Tominaga, Sakai (JP); Masahiro Yoshida, Sakai (JP); Yasuhiro Mimura, Sakai (JP); Akane Sugisaka, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 108 days.

(21) Appl. No.: 16/383,990

(22) Filed: Apr. 15, 2019

(65) Prior Publication Data

US 2019/0319046 A1    Oct. 17, 2019

(30) Foreign Application Priority Data

Apr. 16, 2018   (JP) .................................. 2018-078206

(51) Int. Cl.
*H01L 27/12* (2006.01)
*H01L 27/02* (2006.01)
*G02F 1/1362* (2006.01)

(52) U.S. Cl.
CPC ...... *H01L 27/124* (2013.01); *G02F 1/136204* (2013.01); *H01L 27/0255* (2013.01); *H01L 27/1225* (2013.01)

(58) Field of Classification Search
CPC ............... H01L 27/1225; H01L 27/124; H01L 27/1244; H01L 27/0255; G02F 1/136204; G02F 1/136259; G02F 1/1309
See application file for complete search history.

(56) References Cited

U.S. PATENT DOCUMENTS 5,744,837 A * 4/1998 Kamiura ........... G02F 1/136204
                                              257/355
6,122,030 A * 9/2000 Nagata ............. G02F 1/136204
                                              349/153
(Continued)

FOREIGN PATENT DOCUMENTS

JP       S63-106788 A    5/1988
JP       H08-146460 A    6/1996
(Continued)

OTHER PUBLICATIONS

English translation of Japanese Notice of Reasons for Rejection dated Apr. 14, 2020.

*Primary Examiner* — Errol V Fernandes
*Assistant Examiner* — Jeremy J Joy
(74) *Attorney, Agent, or Firm* — ScienBiziP, P.C.

(57) ABSTRACT

Provided is an active matrix substrate that includes a thin film transistor that has a first semiconductor layer and an ESD protection circuit. The ESD protection circuit includes a diode element. The diode element has a first electrode in a gate metal layer, a second semiconductor layer that overlaps a first electrode, and a second electrode and a third electrode electrically connected to a second semiconductor layer in a source metal layer. First and second electrodes of the diode element are electrically connected. The ESD protection circuit further includes a reserve diode structure. The reserve diode structure includes a fourth electrode in the gate metal layer and is in an electrically floating state, and a third semiconductor layer that is formed in the same layer as the first and second semiconductor layers and overlaps the fourth electrode with an insulation layer in between.

18 Claims, 25 Drawing Sheets

(56) References Cited

U.S. PATENT DOCUMENTS

| | | | |
|---|---|---|---|
| 6,624,857 B1* | 9/2003 | Nagata | G02F 1/1309 349/139 |
| 8,542,337 B2* | 9/2013 | Zhang | H01L 27/124 349/139 |
| 2001/0045998 A1* | 11/2001 | Nagata | G02F 1/136204 349/40 |
| 2004/0174645 A1 | 9/2004 | Nojiri et al. | |
| 2007/0029615 A1* | 2/2007 | Lai | G02F 1/136204 257/355 |
| 2007/0030434 A1* | 2/2007 | Hirabayashi | G02F 1/136204 349/149 |
| 2011/0024754 A1 | 2/2011 | Yamazaki | |
| 2012/0138922 A1 | 6/2012 | Yamazaki et al. | |
| 2013/0002312 A1 | 1/2013 | Yamazaki et al. | |
| 2013/0320334 A1 | 12/2013 | Yamazaki et al. | |
| 2014/0286076 A1 | 9/2014 | Aoki et al. | |
| 2015/0269900 A1 | 9/2015 | Iwamoto et al. | |
| 2016/0027372 A1* | 1/2016 | Yan | H01L 27/0296 345/211 |
| 2017/0038650 A1* | 2/2017 | Nakanishi | G09F 9/30 |
| 2017/0168361 A1* | 6/2017 | Gai | G02F 1/136259 |

FOREIGN PATENT DOCUMENTS

| | | |
|---|---|---|
| JP | H11-174970 A | 7/1999 |
| JP | H11-271722 A | 10/1999 |
| JP | H11-338376 A | 12/1999 |
| JP | 2004-271840 A | 9/2004 |
| JP | 2011-028115 A | 2/2011 |
| JP | 2012-134475 A | 7/2012 |
| JP | 2013-033944 A | 2/2013 |
| JP | 2014-007399 A | 1/2014 |
| JP | 2014-209727 A | 11/2014 |
| WO | 2014/061574 A1 | 4/2014 |

* cited by examiner

ACTIVE MATRIX SUBSTRATE, DISPLAY DEVICE, AND METHOD FOR REPAIRING DEFECT OF ACTIVE MATRIX SUBSTRATE

BACKGROUND

1. Field

The present disclosure relates to an active matrix substrate, a display device, and a method of repairing a defect of an active matrix substrate.

2. Description of the Related Art

An active matrix substrate that is used in a liquid crystal display device or the like has a display area that has multiple pixels and an area (a non-display area or a frame area) other than the display area. Provided in the display area a thin film transistor (hereinafter referred to as "TFT") for every pixel. As the TFT, a TFT (hereinafter referred to as "amorphous silicon TFT") of which an activation layer is an amorphous silicon film, or a TFT (hereinafter referred to as "polycrystalline silicon TFT") of which an activation layer is a polycrystalline silicon film is widely used.

In recent years, it has proposed that instead of amorphous silicon or polycrystalline silicon, an oxide semiconductor is used as a material of the activation layer of the TFT. This TFT is referred to as "oxide semiconductor TFT". The oxide semiconductor has higher mobility than the amorphous silicon. For this reason, it is possible that the oxide semiconductor TFT operates at a higher speed than the amorphous silicon TFT.

In some cases, a peripheral circuit such as a drive circuit is monolithically (integrally) formed in the non-display area of the active matrix substrate. By monolithically forming the dive circuit, narrowing-down of the non-display (frame narrowing) or cost reduction that results from simplifying a mounting process is realized. For example, in some cases, in the non-display area, a gate driver circuit is monolithically formed, or a source driver circuit is mounted using a Chip on Glass (COG) method. The gate driver circuit that is monolithically formed is referred to as a gate driver monolithic (GDM) circuit. In International Publication No. 2014/061574, a liquid crystal display device in which the GDM circuit is formed on the active matrix substrate that includes the oxide semiconductor TFT is disclosed.

In the liquid crystal display device that includes the GDM circuit, in some cases, linear luminance nonuniformity (hereinafter referred to as "horizontal line nonuniformity") occurs along a direction that extends a gate wiring line. A cause of this horizontal line nonuniformity is as follows.

In some cases, a diode ring is provided, as a protection circuit (referred to as "ESD protection circuit" in the specification in the present application) for protecting the GDM circuit from electrostatic discharge (ESD), between wiring lines (the GDM wiring line) along which a signal is supplied to the GDM circuit. The diode ring is configured with two diode elements that are connected in parallel in such a manner that forward directions are opposite to each other between two wiring lines.

By providing this diode ring, it is possible that the GDM circuit is protected from the ESD. However, in some cases, the diode ring itself is damaged due to static electricity or the like from the outside, a characteristic of the diode ring is shifted, and thus resistivity of the diode ring decreases. In this case, an amount of leak electric current increases between the GDM wiring lines, and because of this, output from, the GDM circuit to the gate wiring line is abnormal.

For example, when the resistivity between a clock signal line and a low-electric, potential wiring line increases, the dullness of a waveform of a gate signal differs among the GDM wiring lines. When, the lowering of the resistivity of a certain diode ring takes place, the dullness of a waveform of the corresponding gate wiring line differs depending on a positional relationship between the certain diode ring and the GDM wiring line. Because of this, the luminance non-uniformity results.

In Japanese Unexamined Patent Application No. 11-174970, it is disclosed that a circuit (referred to as "serial body" in Japanese Unexamined Patent Application No. 11-174970) in which two non-linear elements (diode elements) are connected in series is used as a static electricity protection structure. Furthermore, in Japanese Unexamined Patent Application No. 11-174970, a configuration (which is a so-called bipartite diode ring) in which two serial bodies are connected in parallel in opposite directions between wiring lines is also disclosed. When one of two diode elements that constitute the serial body using the shape of the bipartite diode ring is damaged due to the static discharge, it can be ensured that the other diode element can take over the function of the damaged diode element. However, in this configuration, understandably, there is a tendency for the resistivity of the entire diode ring to increase (for electric current to flow). For this reason, an original function of providing protection against the static electricity is inferior.

It is desirable to suitably keep display quality or the like from decreasing due to damage to, or characteristic shift of, a diode element of an ESD protection circuit that is provided in an active matrix substrate.

SUMMARY

According to an aspect of the disclosure, there is provided an active matrix substrate including: a substrate; multiple wiring lines that include multiple gate wiring lines and multiple source wiring lines, the multiple wiring lines being provided in the substrate; multiple thin film transistors each of which has a gate electrode, a source electrode, a drain electrode, and a first semiconductor layer, the multiple thin film transistors being supported on the substrate; multiple ESD protection circuits each of which is electrically connected to two wiring lines, among the multiple wiring lines; a gate metal layer that includes the multiple gate wiring lines and the gate electrodes of the multiple thin film transistors; and a source metal layer that the multiple source wiring lines and the source electrodes and the drain electrodes of the multiple thin film transistors, in which each of the multiple ESD protection circuits includes at least one or more diode element, in which each of the at least one or more diode elements includes a first electrode that is included in the gate metal layer, a second semiconductor layer that is formed on the same layer as the first semiconductor layer and at least partially overlaps the first electrode with an insulation layer in between, and a second electrode and a third electrode that are electrically connected to the second semiconductor layer, the second electrode and the third electrode being included in the source metal layer, in which the first electrode and the second electrode of the at least one or more diode elements are electrically connected to each other, in which each of the multiple ESD protection circuits further includes at least one or more reserve diode structures, and in which each of the at least one or more reserve diode structures includes a fourth electrode that is in an electrically floating state, the fourth electrode being included in the gate metal layer, and a third semiconductor layer that is formed on the same layer as the first semiconductor layer and the second semiconductor layer and at least partially overlaps the fourth electrode with the insulation layer in between.

According to another aspect of the disclosure, there is provided a display device that includes an active matrix substrate which has the configuration described above.

According to still another aspect of the disclosure, there is provided a method of repairing a defect of the active matrix substrate described above, the method including: specifying an ESD protection circuit in which at least one of the two diode elements is damaged due to electrostatic discharge, among the multiple ESD protection circuits; cutting at least one of the first connection wiring line and the second wiring line by illuminating a prescribed give portion with a laser beam, in the specified ESD protection circuit; and connecting the fourth electrode and the fifth electrode by illuminating a portion where the fourth electrode and the fifth electrode of each of the two reserve diode structures overlap, with the laser beam, in the specified ESD protection circuit.

According to still another aspect of the disclosure, there is provided a method of repairing a defect of the active matrix substrate described above, the method including: specifying an ESD protection circuit in which at least one of the two diode elements is damaged due to electrostatic discharge, among the multiple ESD protection circuits; cutting at least one of the first connection wiring line and the second wiring line by illuminating a prescribed portion with a laser beam, in the specified ESD protection circuit; and connecting the second connection electrode of the first reserve diode structure and the first connection wiring line and connecting the second connection electrode of the second reserve diode structure and the second connection wiring line, by illuminating a portion where the second connection electrode of the first reserve diode structure and the first connection wiring line overlap and a portion wherein the second connection electrode of the second reserve diode structure and the second connection wiring line overlap, in the specified ESD protection circuit.

DESCRIPTION OF THE EMBODIMENTS

Embodiments of the present disclosure will be described below with reference to the drawings. It is noted that the present disclosure is not limited to the following embodiments.

First Embodiment

Figure 1:
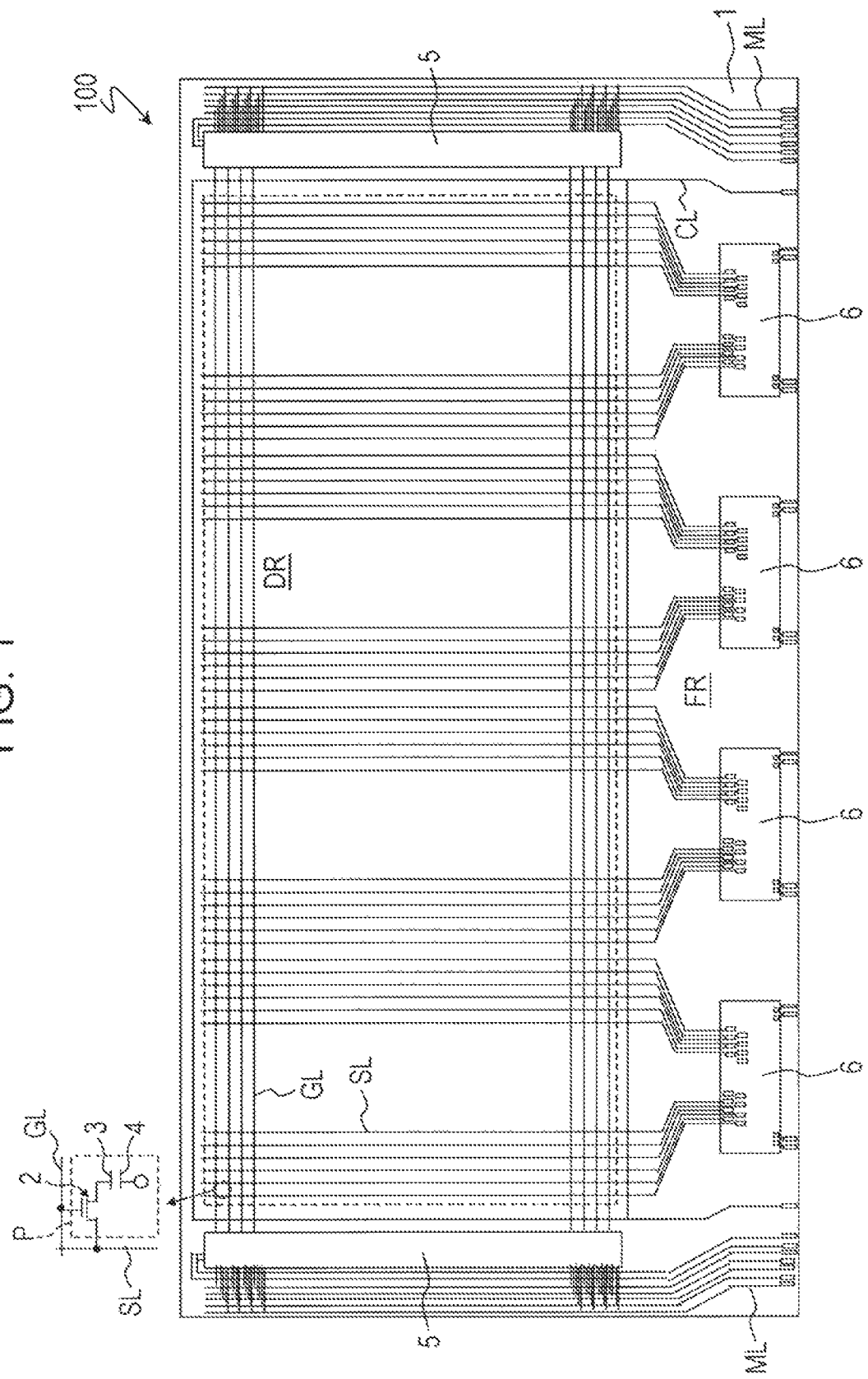
FIG. 1 is a schematic diagram illustrating an example of a planar structure of an active matrix substrate according to an embodiment of the present disclosure.

An active matrix substrate 100 according to the present embodiment is described with reference to FIG. 1. FIG. 1 is a schematic diagram illustrating an example of a planar structure of the active matrix substrate 100. The active matrix substrate 100, as illustrated in FIG. 1, has a display area DR and a peripheral area FR.

The display area DR is defined by multiple pixel areas P that are arranged in matrix form. The pixel area P is an area that corresponds to a pixel of a display device.

The peripheral area FR is positioned in the vicinity of the display area DR. The peripheral area FR is an area that does not contribute to display and, in some cases, also referred to as "non-display area" or "frame area".

A constituent element of the active matrix substrate 100 is supported on a substrate 1. The substrate 1, for example, is a glass substrate.

Provided on the substrate 1 are multiple wire lines that include multiple gate wiring lines GL and multiple source wiring lines SL. Each of the multiple gate wiring lines GL extends along a row direction. Each of the multiple source wiring lines SL extends in a column direction.

Typically, an area that is surrounded by two neighboring gate wiring lines GL and two neighboring source wiring lines SL is the pixel area P. An equivalent circuit in one pixel area P is illustrated at in the upper left corner of FIG. 1. As illustrated in this equivalent circuit, each pixel area P includes a thin film transistor 2 and a pixel electrode 3.

Thin film transistor 2 is also referred to as "pixel TFT". A pixel TFT 2 is supported on the substrate 1 and has a gate electrode, a source electrode, a drain electrode, and a semiconductor layer. At this point, the pixel TFT 2 is of a bottom gate type, but is not limited to this.

A gate electrode of the pixel TFT 2 is formed on the same layer as the gate wiring line GL. More precisely, the gate electrode is formed from the same conductive film (a gate metal film) as the gate wiring line GL. In the specification in the present application, an electrode or a wiring line that is formed from the gate metal film is collectively referred to as "gate metal layer". Therefore, the gate metal layer includes multiple gate wiring lines GL and gate electrodes of multiple pixel TFTs 2.

The source electrode and the drain electrode of the pixel TFT 2 are formed on the same layer as the source wiring line SL. More precisely, the source electrode and the drain electrode is formed from the same conductive film (source metal film) as the source wiring line SL. In the specification in the present application, an electrode or a wiring line that is formed from the source metal film is collectively referred to as "source metal layer". Therefore, the source metal layer includes multiple source wiring lines SL, and source electrodes and drain electrode of multiple pixel TFTs 2.

Furthermore, in the following, in some cases, a semiconductor layer of the pixel TFT 2 is also referred to as "first semiconductor layer". In the present embodiment, the pixel TFT 2 is an oxide; semiconductor TFT. More precisely, the semiconductor layer (the first semiconductor layer) of the pixel TFT 2 is an oxide semiconductor layer.

The gate electrode and the source electrode of the pixel TFT 2 are connected to the corresponding gate wiring line GL and the corresponding source wiring line SL, respectively. Furthermore, the drain electrode of the pixel TFT 2 is connected to the pixel electrode 3. In a case where the active matrix substrate 100 is used in a liquid crystal display device that operates in a transverse electric field mode such as a fringe field switching (FFS), an electrode (a common electrode) 4 that is common to multiple pixel area P is provided on the active matrix substrate 100. In a case where the active matrix substrate 100 finds application in a liquid crystal display device that operates in a longitudinal electric field mode, the common electrode 4 is provided on an opposite substrate that is positioned in such a manner as to face the active matrix substrate 100 with a liquid crystal layer in between.

Arranged in the peripheral area FR are a gate driver (a scan line drive circuit 5 that drives the gate wiring line GL and a source driver (a signal line drive circuit) 6 that drives the source wiring line SL. In the present embodiment, the gate driver 5 is a GDM circuit is integrally (monolithically) formed on the substrate 1. Furthermore, the source driver 6 is mounted (for example, COG-mounted) on the substrate 1.

In an example that is illustrated, the gate driver 5 is arranged to the left and the right of the display area DR, and the source driver 6 is positioned under the display area DR. Gate wiring lines GL are connected to multiple output terminals, respectively, that the gate driver 5 has. Source wiring lines SL are connected to multiple output terminals, respectively, that the source driver 6 has.

Furthermore, in the peripheral area FR, multiple wiring lines (each of which is hereinafter referred to as "GDM wiring line") ML for supplying a signal to the gate driver (the GDM circuit) 5 is provided on the substrate 1. Multiple GDM wiring lines ML, for example, include multiple clock signal lines along which a clock signal (CK) is supplied, a low-electric potential wiring line along which a low-electric potential side power source voltage (VSS) of a gate signal is supplied, a start pulse wiring line along which a start signal (GSP) is provided to a start end of a shift register, and a reset wiring line for resetting a specific node within the GDM circuit 5 to a fixed electric potential, and the like. In an example that is illustrated, a common wiring line CL for supplying a common voltage is provided in the peripheral area FR, in such a manner as to encompass the display area DR.

Figure 2:
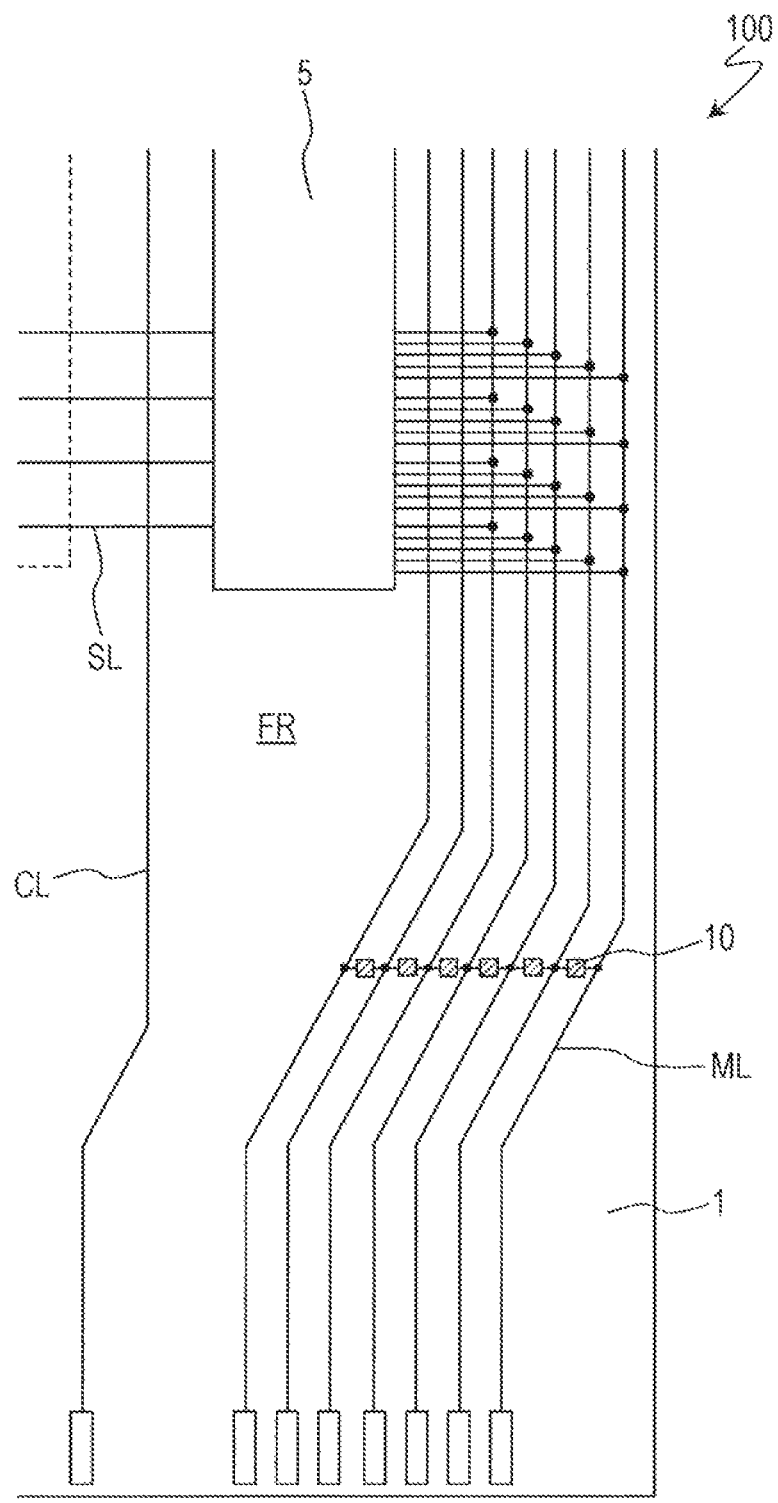
FIG. 2 is a plan-view diagram illustrating the vicinity of a GDM wiring line of the active matrix substrate.

FIG. 2 illustrates the vicinity of the GDM wiring line in an enlarged manner. As illustrated in FIG. 2, the active matrix substrate 100 according to the present embodiment includes multiple ESD protection circuits 10 that are arranged in the peripheral area FR. Each ESD protection circuit 10 is electrically connected to two GDM wiring lines ML (more precisely, two neighboring GDM wiring lines ML), among multiple GDM wiring lines ML. The ESD protection circuit 10 protects the GDM circuit 5 from electrostatic discharge (ESD).

Figure 3:
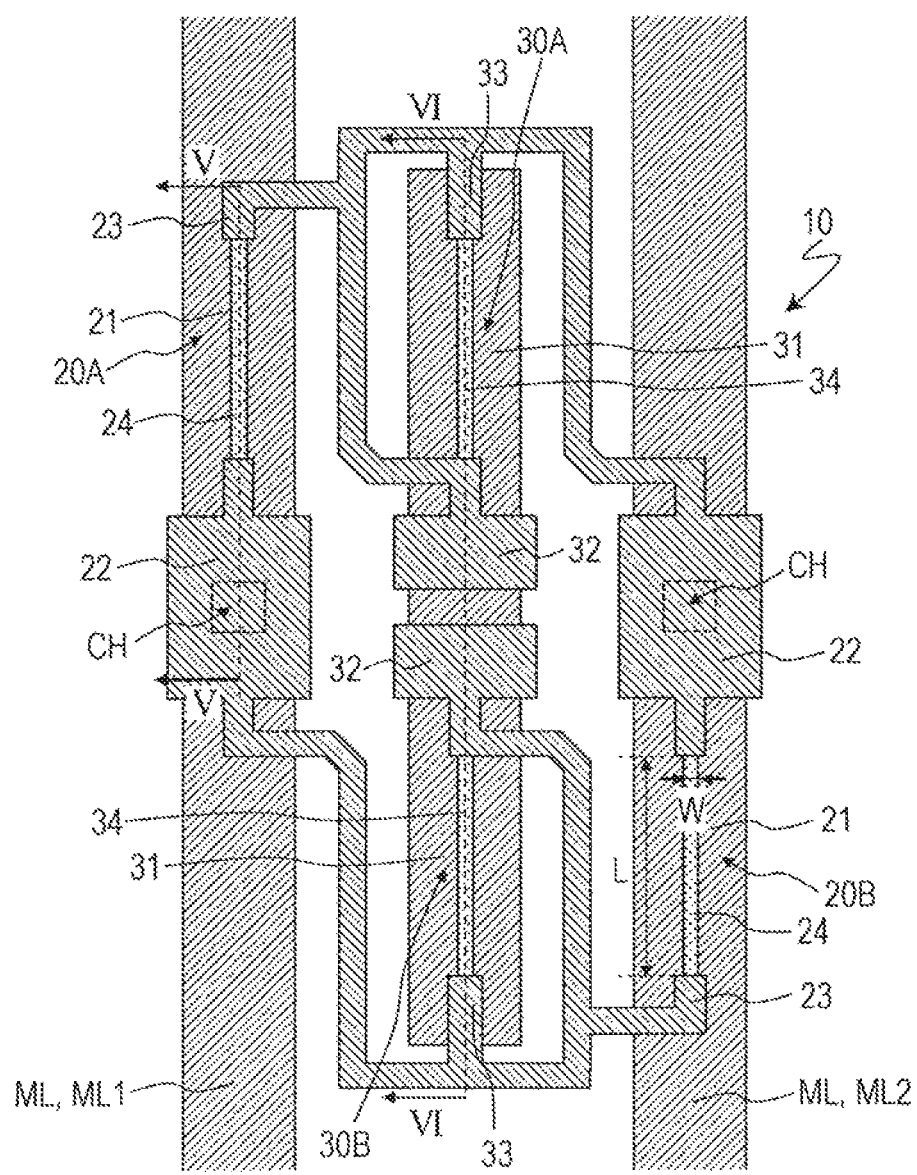
FIG. 3 is a plan-view diagram schematically illustrating an ESD protection circuit of the active matrix substrate.
Figure 4:
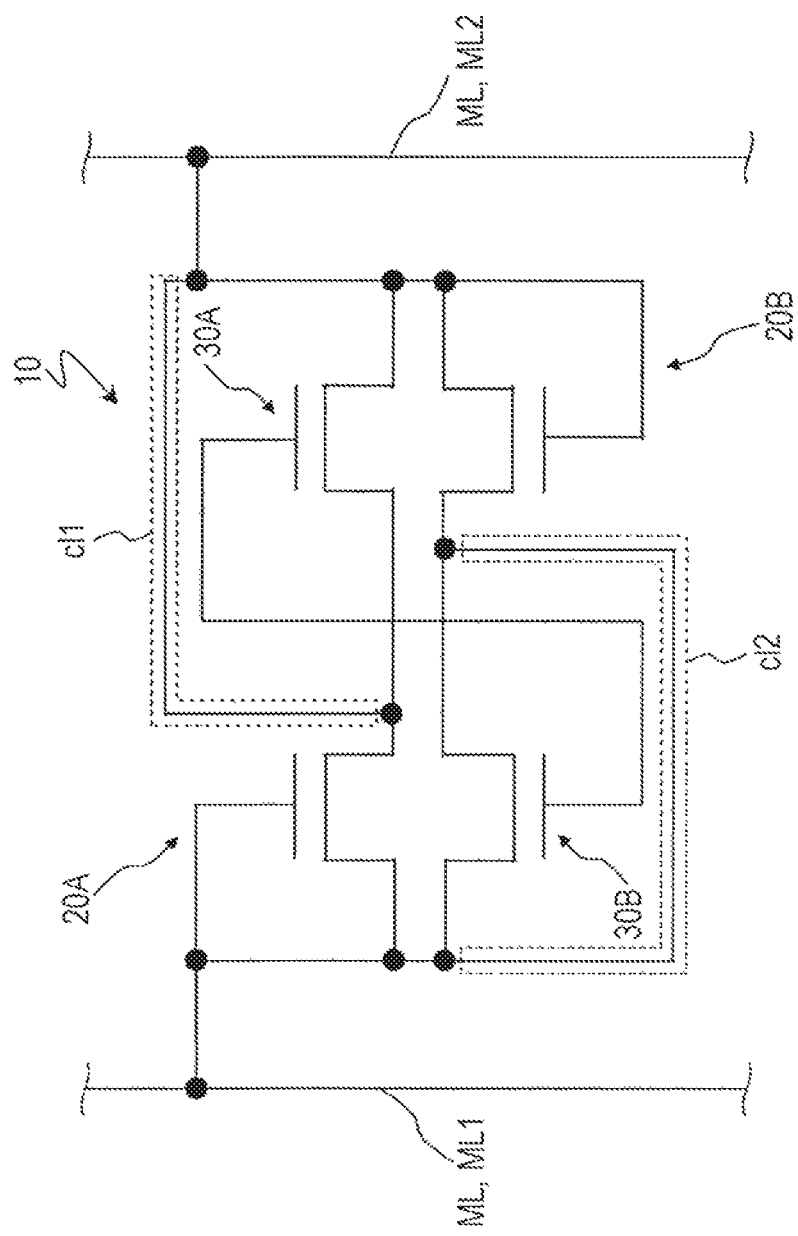
FIG. 4 is a diagram of a circuit that is equivalent to the ESD protection circuit 10.

A specific configuration of the ESD protection circuit 10 will be described with reference to FIGS. 3 and 4. FIG. 3 is a plan-view diagram schematically illustrating the ESD protection circuit 10. FIG. 4 is a diagram of a circuit that is equivalent to the ESD protection circuit 10.

As illustrated in FIGS. 3 and 4, the ESD protection circuit 10 includes two diode elements, diode elements 20A and 20B. The diode elements 20A and 20B are; connected in parallel between two GDM wiring lines ML, in such a manner that forward directions are opposite to each other. In the following, a GDM wiring line ML1 that is one of the two GDM wiring lines ML is also referred to as "first GDM wiring line", and a GMD wiring line ML2 that is the other of the two GDM wiring lines ML is also referred to as "second GDM wiring line". The diode element 20A that is one of the two diode elements, the diode elements 20A and 20B, is also referred to as "first diode element". The diode element 20B that is the other of the two diode elements, the diode elements 20A and 20B, is also referred to as "second diode element".

Furthermore, the ESD protection circuit 10 according to the present embodiment further includes two reserve diode structures 30A and 30B. Each of the reserve diode structures 30A and 30B is a structure, as is, that does not function as a diode element, and, by performing a sequence of processes, as will be described below, can function as a diode element. In the following, the reserve diode structure 30A that is one of the two reserve diode structures 30A and 30B is also referred to as "first reserve diode structure", and the reserve diode structure 30B that is the other one is also referred to as "second reserve diode structure".

Figure 5:
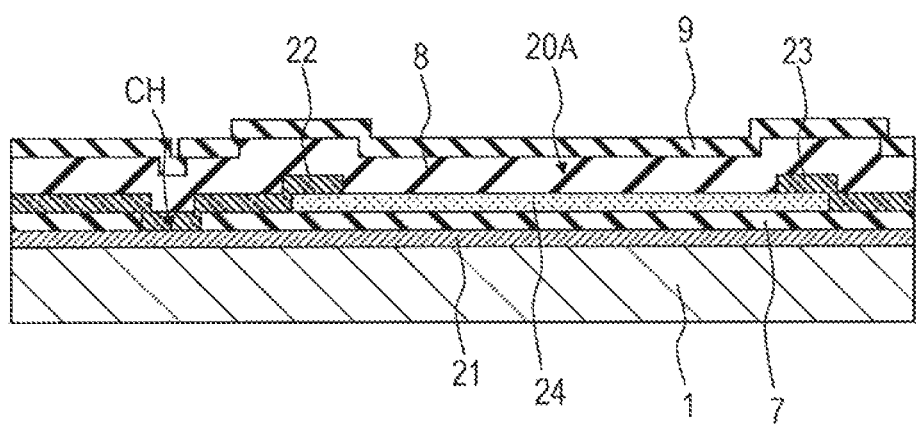
FIG. 5 is a cross-sectional diagram of the ESD protection circuit taken long line V-V in FIG. 3.
Figure 6:
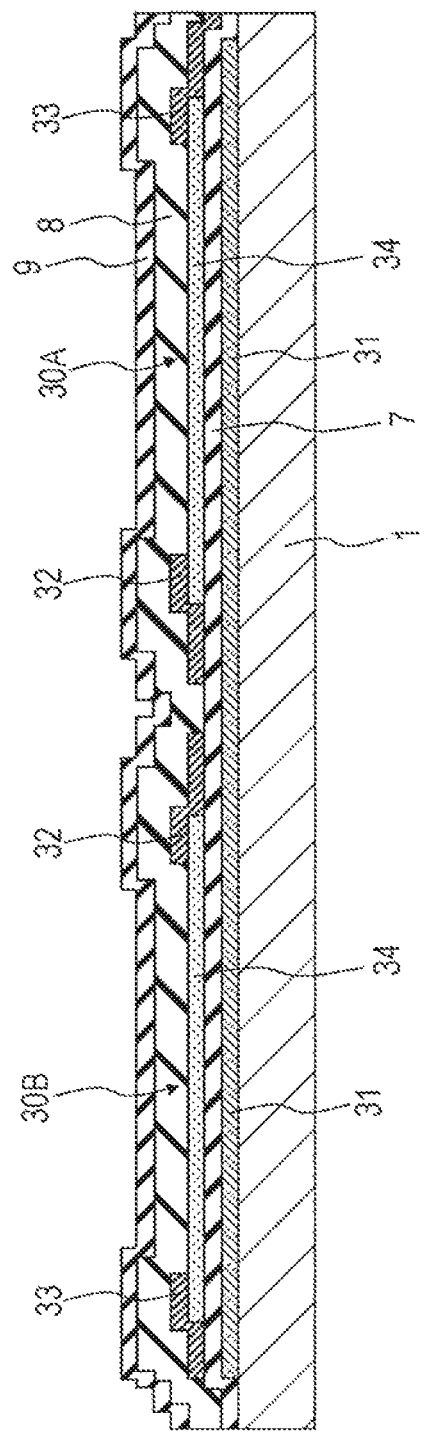
FIG. 6 is a cross-sectional diagram, of the ESD protection circuit cut along line VI-VI in FIG. 3.

At this point, structures of the diode elements 20A and 20B and the reserve diode structures 30A and 30B are described with reference again to FIGS. 5 and 6. FIGS. 5 and 6 are cross-sectional diagrams of the ESD protection circuit 10 taken along line V-V and line VI-VI, respectively, in FIG. 3.

Each of the diode elements 20A and 20B, as illustrated in FIGS. 3 and 5, has a first electrode 21, a second electrode 22, and a third electrode 23, and a second semiconductor layer 24.

The first electrode 21 is included in the gate metal layer. More precisely, the first electrode 21 is formed from the gate metal film and in other words, is formed in the same layer as the gate wiring line GL or the gate electrode of the pixel TFT 2. The gate metal layer, for example, has a multi-layered structure that results from stacking a titanium (Ti) layer and a copper (Cu) layer in this order one on top of another.

The second semiconductor layer 24 is formed on the same layer as the first semiconductor layer (the semiconductor layer of the pixel TFT 2). More precisely, the second semiconductor layer 24 is formed from the same oxide semiconductor film as the first semiconductor layer. The second semiconductor layer 24 at least partially overlaps the first electrode 21 with a gate insulation layer 7 in between. The second semiconductor layer 24, for example, is an In—Ga—Zn—O-based semiconductor layer. The gate insulation layer 7, for example, has a multi-layered structure that results from stacking a silicon nitride (SiNx) layer and a silicon oxide ($SiO_2$) layer in this order one on top of another.

The second electrode 22 and the third electrode 23 are included in the source metal layer. More precisely, the second electrode 22 and the third electrode 23 are formed from the source metal film and in other words, is formed on the same layer as the source wiring line SL or the source electrode and the drain electrode of the pixel TFT2. The second electrode 22 and the third electrode 23 are electrically connected to the second semiconductor layer 24. The source metal layer, for example, has a multi-layered structure that results from stacking a titanium (Ti) layer and a copper (Cu) layer in this order one on top of another.

The first electrode 21 and the second electrode 22 of each of the diode elements 20A and 20B are electrically connected to each other. In an example that is illustrated, a contact hole CH through which a portion of the first electrode 21 is exposed is formed in the gate insulation layer 7, and the second electrode 22 is connected to the first electrode 21 in the contact hole CH.

In this manner, the diode elements 20A and 20B have a configuration in which the gate electrode and the source electrode (or the drain electrode) of the TFT that has the same structure as the pixel TFT 2 are short-circuited. More precisely, the diode elements 20A and 20B are TFT type diodes. A channel width W and a channel length of each of the diode elements 20A and 20B, for example, are 4 μm and 60 μm, respectively, but can be suitably changed according to a drive voltage or a wiring line capacity.

The diode elements 20A and 20B are covered with a first inter-layer insulation layer 8 and a second inter-layer insulation layer 9 that is formed on the first inter-layer insulation layer 8. The first inter-layer insulation layer 8, for example, has a multi-layered structure that results from stacking a $SiO_2$ layer and an organic insulation layer (or a SiNx layer) in this order one on top of anther. The second inter-layer insulation layer 9, for example, is a SiNx layer. At this point, the active matrix substrate 100 is for a liquid crystal display device that operates in the FFS mode. One of the pixel electrode 3 and the common electrode 4 is provided on the first inter-layer insulation layer 8 (between the first inter-layer insulation layer 8 and the second inter-layer insulation layer 9), and the other is provided on the second inter-layer insulation layer 9.

As already illustrated, the diode elements 20A and 20B are connected in parallel between the first GDM wiring line ML1 and the second GDM wiring line ML2, in such a manner that forward directions are opposite to each other. Specifically, the first electrode 21 and the second electrode 22 of the first diode element 20A are electrically connected to the first GDM wiring line ML1, and the third electrode 23 of the first diode element 20A is connected to the second GDM wiring line ML2. Furthermore, the first electrode 21 and the second electrode 22 of the second diode element 20B are electrically connected to the second GDM wiring line ML2, and the third electrode 23 the second diode element 20B is electrically connected to the first GDM wiring line ML1.

Each of the reserve diode structures 30A and 30B, as illustrated in FIGS. 3 and 6, has a fourth electrode 31, a fifth electrode 32 and a sixth electrode 33, and a third semiconductor layer 34.

The fourth electrode 31 is included in the gate metal layer. More precisely, the fourth electrode 31 is formed from the gate metal film and, in other words, is formed on the same layer as the gate wiring line GL, or the gate electrode of the pixel TFT 2 and the first electrode 21 of each of the diode elements 20A and 20B.

The third semiconductor layer 34 is formed on the same layer as the first semiconductor layer and the second semiconductor layer 24. More precisely, the third semiconductor layer 34 is formed from the same oxide semiconductor film as the first semiconductor layer and the second semiconductor layer 24. The third semiconductor layer 34 at least partially overlaps the fourth electrode 31 with the gate insulation layer 7 in between.

The fifth electrode 32 and the sixth electrode 33 are included in the source metal layer. More precisely, the fifth electrode 32 and the sixth electrode 33 are formed from the source metal film and in other words, is formed on the same layer as the source wiring line SL, or the source electrode and the drain electrode of the pixel TFT 2 and the second electrode 22 and the third electrode 23 of each of the diode elements 20A and 20B. The fifth electrode 32 and the sixth electrode 33 are electrically connected to the third semiconductor layer 34.

Each of the fifth electrode 32 and the sixth electrode 33 at least partially overlaps the fourth electrode 31 with the gate insulation layer 7 in between. However, the fourth electrode 31 is in an electrically floating state without being electrically connected to any one of the fifth electrode 32 and the sixth electrode 33.

The fifth electrode 32 of the first reserve diode structure 30A is electrically connected to the third electrode 23 of the first diode element 20A, and the sixth electrode 33 of the first reserve diode structure 30A is electrically connected to the second GDM wiring line ML2.

The fifth electrode 32 of the second reserve diode structure 30B is electrically connected to the third electrode 23 of the second diode element 20B, and the sixth electrode 33 of the second reserve diode structure 30B is electrically connected to the first GDM wiring line ML1.

The ESD protection circuit 10, as illustrated in FIG. 4, includes a wiring line (hereinafter referred to as "first connection wiring line") cl1 for electrically connecting the third electrode 23 of the first diode element 20A and the second GDM wiring line ML2, and a wiring line (hereinafter referred to as "second connection wiring line") cl2 for electrically connecting the third electrode 23 of the second diode element 20B and the first GDM wiring line ML1.

It is noted that materials of a wiring line or an electrode, an interconnection layer, and the like are not limited to the ones that are described above as examples.

In the active matrix substrate 100, when static electricity that is generated from the outside is dissipated to any one of the multiple GDM wiring lines ML, gates of the diode elements 20A and 20B that are electrically connected to the GDM wiring line ML are opened and electric charge is sequentially diffused toward neighboring GDM wiring line ML. As a result, all GDM wiring lines ML are equipotential. Because of this, with the static electricity, damage to the GDM circuit 5 can be suppressed.

Figure 7:
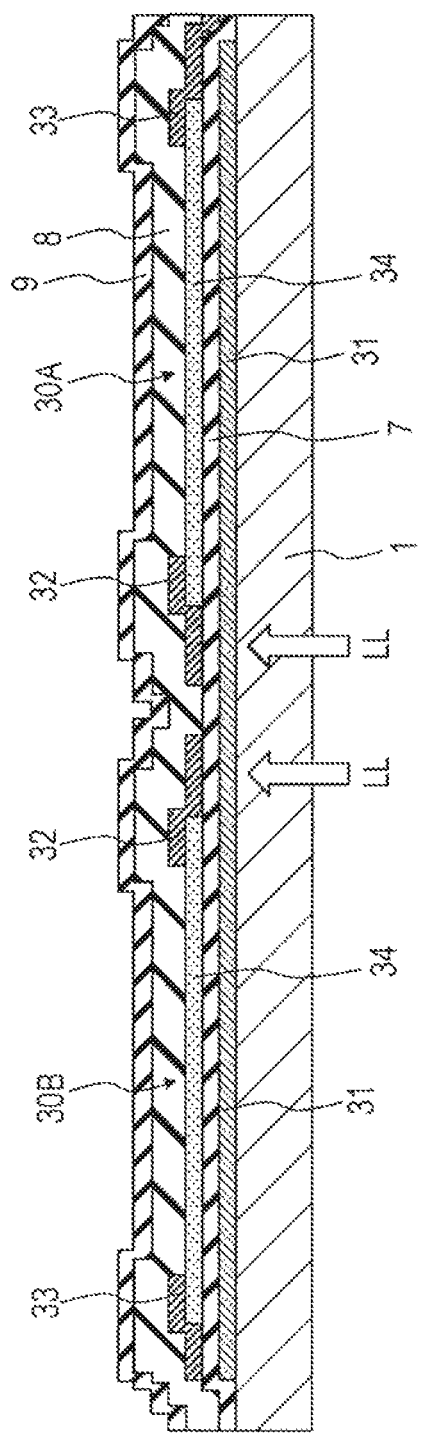
FIG. 7 is a diagram schematically illustrating a case where melt connection is performed by illumination with a laser beam.
Figure 8:
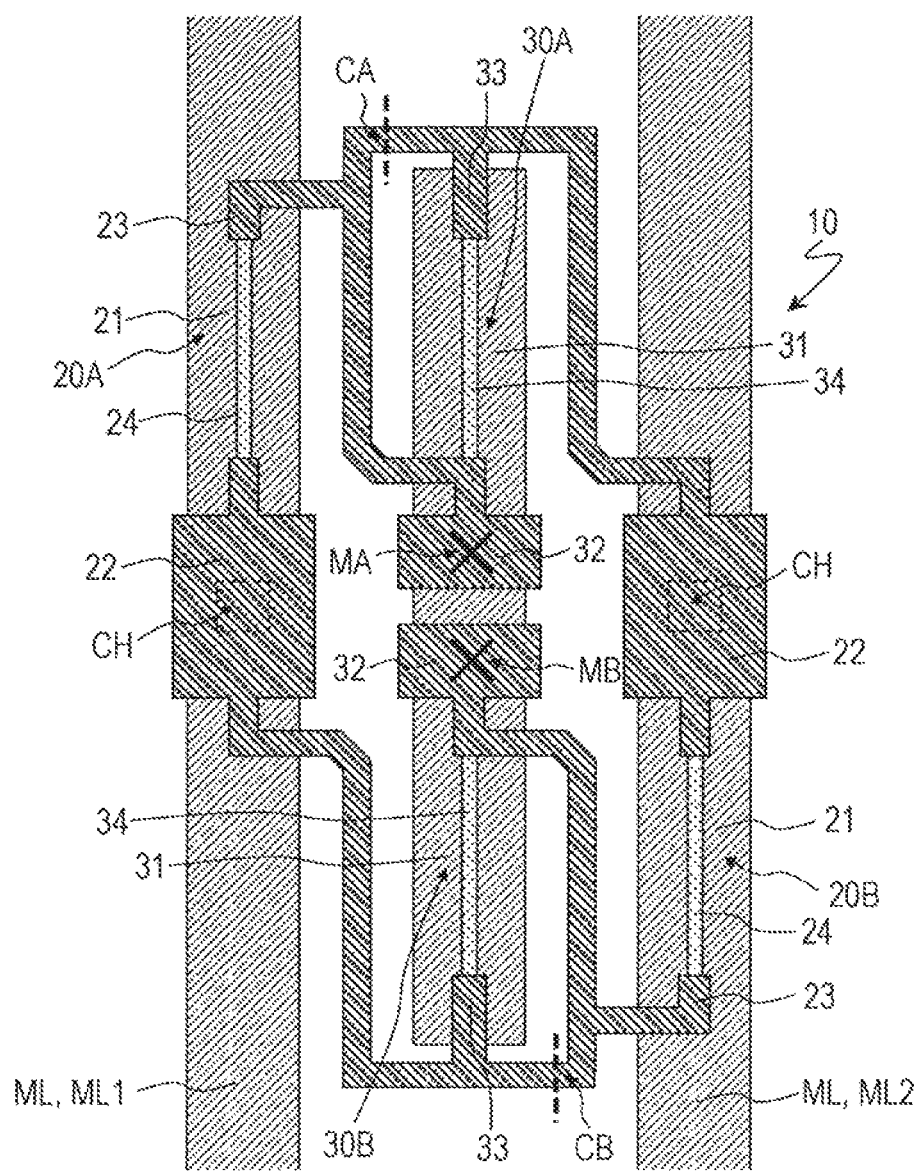
FIG. 8 is a diagram illustrating a portion where cutting and the melt connection by the illumination with the laser beam are performed.
Figure 9:
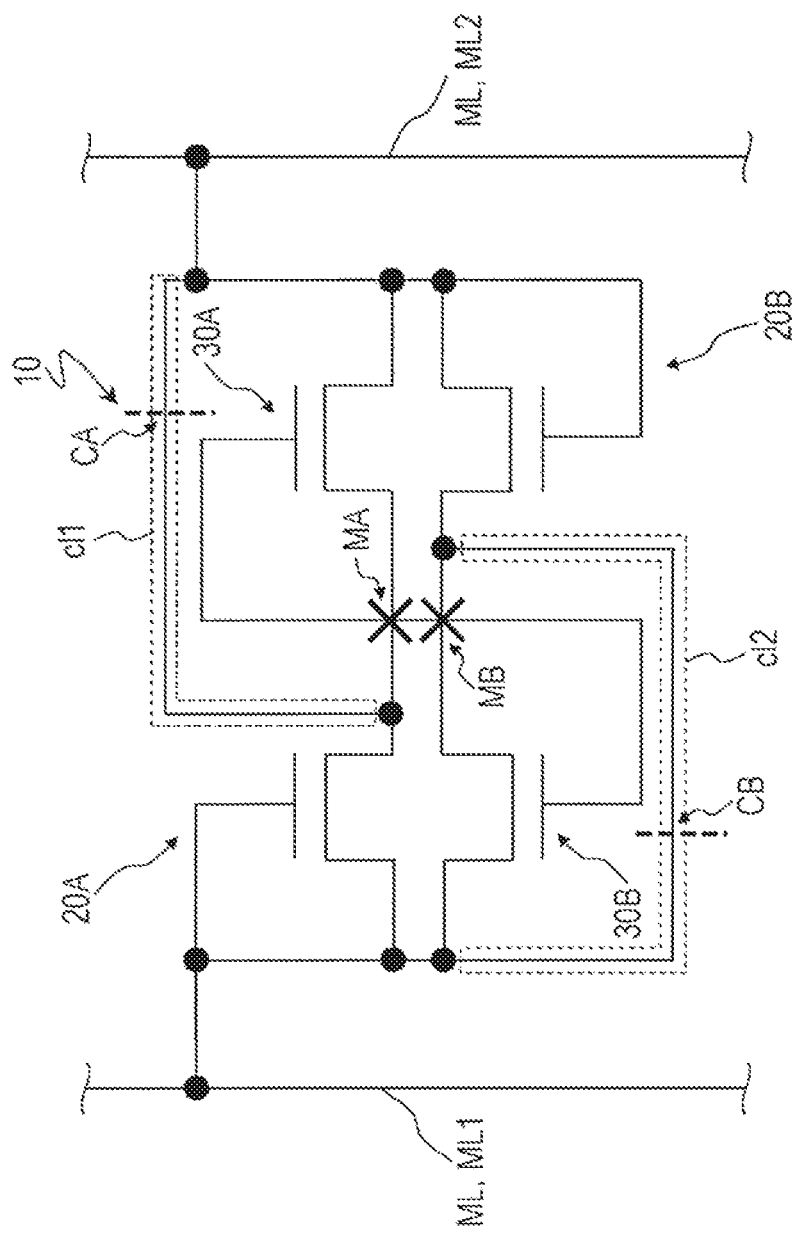
FIG. 9 is a diagram illustrating the portion where the cutting and the melt connection by the illumination with the laser beam are performed.

Furthermore, in the active matrix substrate 100 according to the present embodiment, in a case where the ESD protection circuit 10 has the configuration described above and thus where the diode elements 20A and 20B themselves are damaged due to electrostatic discharge, a sequence of processes, as will be described below, is performed. Thus, the reserve diode structures 30A and 30B can be caused to function as substitute diode elements. More precisely, a defect (a decrease in display quality or the like) due to the electrostatic discharge damage the diode elements 20A and 20B can be repaired. Specifically, cutting and melting connection are performed by illuminating a give portion of the ESD protection circuit 10 with a laser beam, and thus the defect can be repaired. A method of repairing the defect of the active matrix substrate 100 will be described below with reference to FIGS. 7, 8, and 9. FIG. 7 is a diagram schematically illustrating a case where the melting connection is performed by the illumination with the laser beam. FIGS. 8 and 9 are diagrams, each illustrating a portion where the cutting and the melting connection by the illumination with the laser beam are performed.

First, among the multiple ESD protection circuits 10, the ESD protection circuit 10 is specified in which at least one of two diode elements, the diode elements 20A and 20B, is damaged due to the electrostatic discharge (a specifying process). The ESD protection circuit 10 to which the electrostatic discharge damage, for example, can be specified from a situation where horizontal line nonuniformity occurs.

Next, in the specified ESD protection circuit 10, the first connection wiring line cl1 and the second connection wiring line cl2 are cut by illuminating prescribed portions CA and CB (each of which is referred to as "cut portion") with the laser beam (a cutting process).

Subsequently, in the specified ESD protection circuit 10, as illustrated in FIGS. 7, 8, and 9, portions (each of which is hereinafter referred to as "melting portion") MA and MB where the fourth electrode 31 and the fifth electrode 32 of each of two reserve diode structures, the reserve diode structures 30A and 30B, overlaps, is illuminated with a laser beam LL, and thus the fourth electrode 31 and the fifth electrode 32 (a melting connection process). The illumination with the laser beam LL, for example, as illustrated in FIG. 7, is performed from the direction of a rear side of the active matrix substrate 100.

In the melting connection process described above, the fourth electrode 31 and the fifth electrode 32 of the reserve diode structures 30A and 30B are connected, and thus the reserve diode structures 30A and 30B functions as the TFT type diode. Furthermore, in the cutting processing, the first connection wiring line cl1 and the second connection wiring line cl2 are cut, and thus an electric current path that runs passing through only the first diode element 20A or runs passing through only the second diode element 20B is not present between the first GDM wiring line ML1 and the second GDM wiring line ML2.

It is noted that one of the cutting process and the melting connection process may be performed earlier than the other. In a case where the cutting process is first performed, an advantage is as follows. The cutting process is first performed, and before performing the melting connection process, panel inspection is performed a second time to check that the horizontal line nonuniformity does not occur. Thus, it can be checked that the ESD protection circuit 10 is certain to be a target that has to be repaired.

Furthermore, in a case where it can be specified that the electrostatic discharge damage occurs (a defect such as resistance abnormality occurs) to only one of two diode elements, the diode elements 20A and 20B, one cutting portion may be present. Specifically, in a case where the defect occurs to only the first diode element 20A, cutting may be performed only at the cutting portion CA, the first connection wiring line cl1, and in a case where the defect occurs to only the second diode element 20B, the cutting may be performed at the cutting portion CB of the second connection wiring line cl2.

Figure 10:
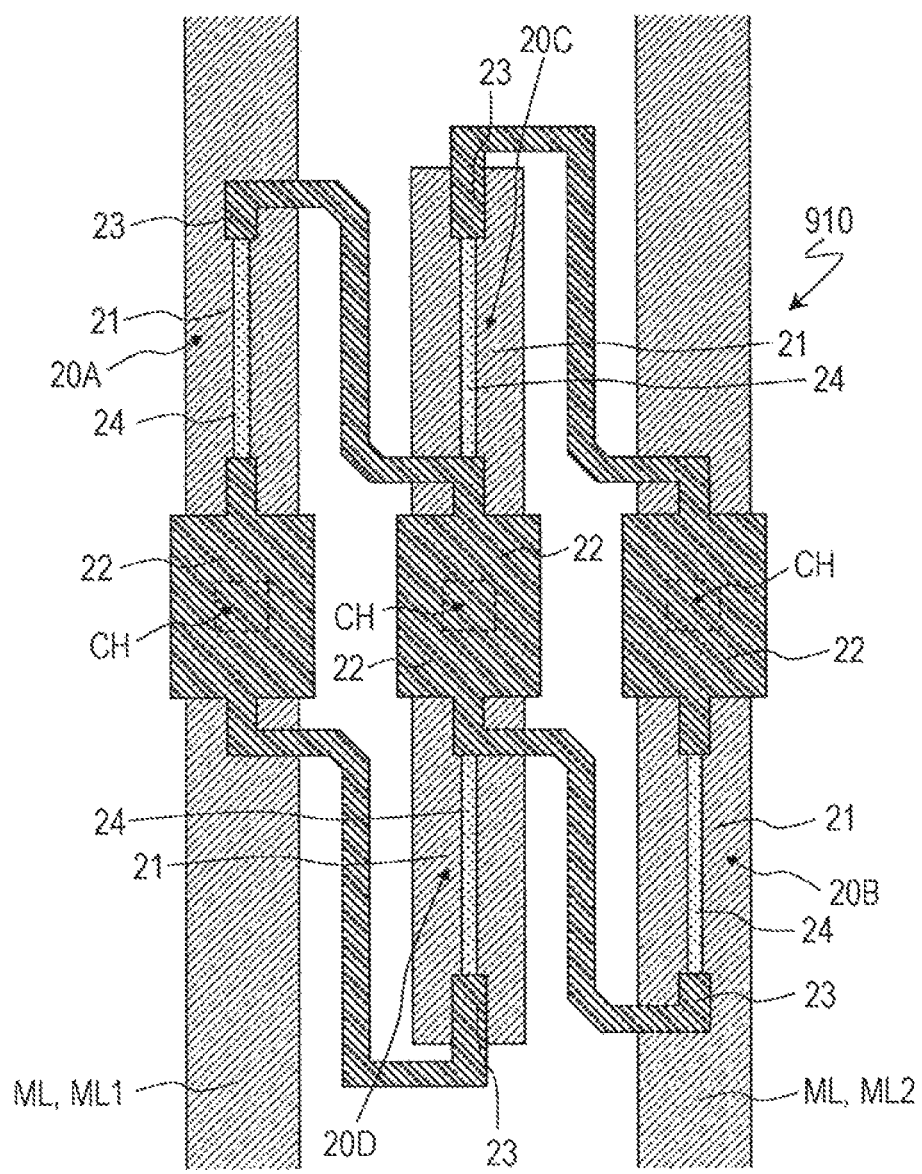
FIG. 10 is a plan-view diagram illustrating the vicinity of an ESD protection circuit that is a reference example.
Figure 11:
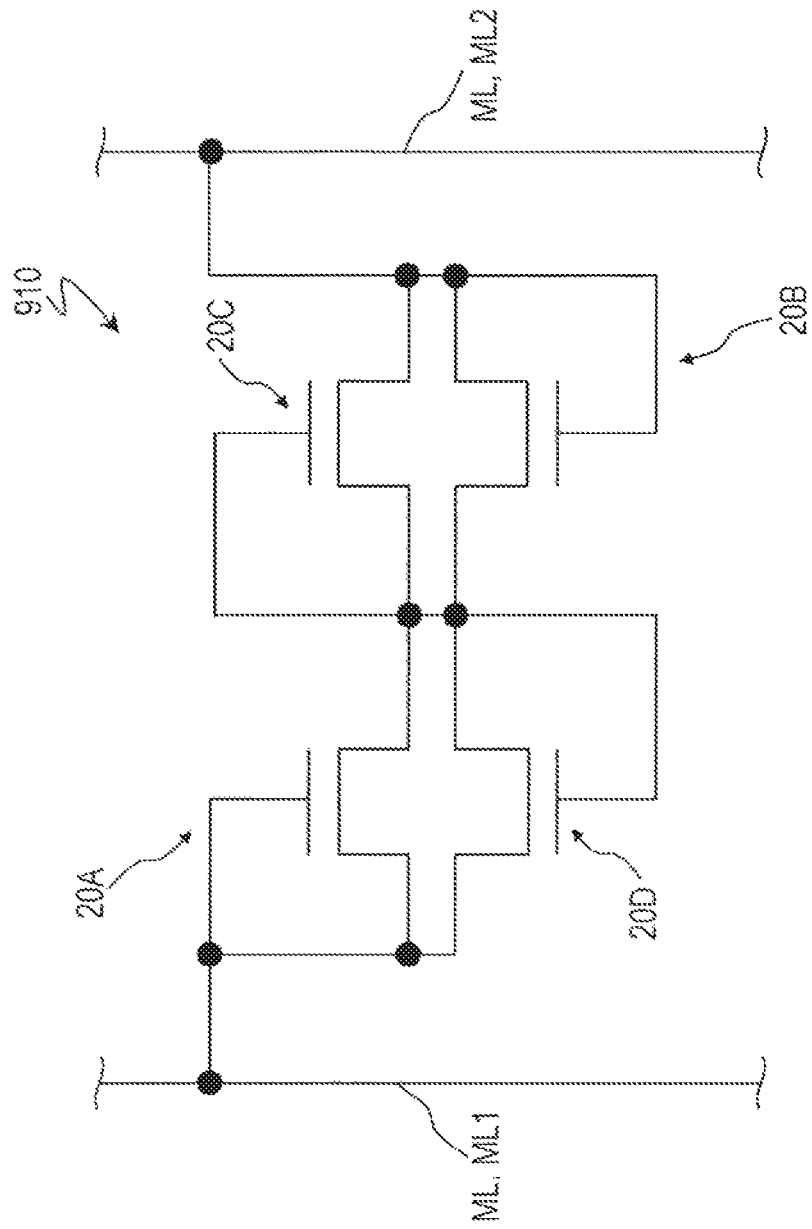
FIG. 11 is a diagram of a circuit that is equivalent to the ESD protection circuit that is the reference example.

As described above, with the active matrix substrate 100 according to the present embodiment, the display quality or the like can be kept from decreasing due to the damage to, or characteristic shift of, the diode elements 20A and 20B of the ESD protection circuit 10. Furthermore, the ESD protection circuit 10 according to the present embodiment has a type of redundant structure as described above, but there is also no concern that an original function of providing protection against the static electricity will not be properly performed due to an increase in resistance of a diode ring as a whole. In this respect, a description will be provided below by comparison of the ESD protection circuit 910 against a reference example that is illustrated in FIGS. 10 and 11. FIG. 10 is a plan-view diagram illustrating an ESD protection circuit 910 that is the reference example. FIG. 11 is a diagram, of a circuit that is equivalent to the ESD protection circuit 910 that is the reference example.

The ESD protection circuit 910 that is the reference example is equivalent to a circuit that results from replacing the reserve diode structures 30A and 30B with a third diode element 20C and a fourth diode element 20D, respectively, in the ESD circuit 10 according to the present embodiment. The third, diode element 20C and the fourth diode element 20D are TFT type diodes that have the same structure as the first diode element 20A and the second diode element 20B. As illustrated in FIGS. 10 and 11, the third diode element 20C is connected in series to the first diode element 20A, and the fourth diode element 20D is connected in series to the second diode element 20B. In this manner, four diodes, diode elements 20A, 20B, 20C, and 20D, of the ESD protection circuit 910 that is the reference example constitutes a so-called bipartite diode ring.

In the ESD protection circuit 910 that is the reference example, although one of the first diode element 20A and the third diode element 20C is damaged due to the electrostatic discharge, it is ensured that the other one functions as the diode ring. In the same manner, although one of the second diode element 20B and the fourth diode element 20D is damaged due to the electrostatic discharge, it is ensured that the other one functions as the diode ring. However, in the ESD protection circuit 910 that is the reference example, two diode elements are connected in series. Because of this, in a state where the electrostatic discharge damage does not occur to the diode element, the resistivity of the entire diode ring is increased (more precisely, it is difficult for electric current to flow. For this reason, the original function of providing the protection against the static electricity is not properly performed.

In contrast, in the ESD protection circuit 10 according to the present embodiment, the reserve diode structures 30A and 30B, as are, do not function as diodes. The reserve diode structures 30A and 30B do not increase the resistivity of the entire diode element differently than the ESD protection circuit 910 that is the reference example. For this reason, the original function of providing the protection against the static electricity is properly performed.

As described above, according to the present embodiment, the display quality or the like can be suitably kept from decreasing due to the damage to, or the characteristic shift of, the diode elements of the ESD protection circuit, with the original function of the ESD protection circuit being properly performed.

It is noted that, in a case where the active matrix substrate 100 is used in the liquid crystal display device, the ESD protection circuit 10 that is positioned in the peripheral area FR can be light-shielded by a light shielding layer (black matrix) that is formed in an area that corresponds to the opposite substrate (a color filter substrate). For this reason, diode characteristic shift can be kept from occurring due to incidence of external light on the second semiconductor layer 24 of each of the diode elements 20A and 20B or the third semiconductor layer 34 of each of the reserve diode structures 30A and 30B.

The active matrix substrate 100 for the liquid crystal display device that operates in the transverse electric field mode (specifically, the FFS mode) is described here as an example. However, the active matrix substrate according to the embodiment of the present disclosure may be for a liquid crystal display device that operates in the longitudinal electric field mode such, as a twisted nematic (TN) mode or a vertical alignment (VA) and may be for an organic EL (OLED) display device or for an electrophoretic display (EPD). In a case where the active matrix substrate is used for other than the liquid crystal display device that operates in the FFS mode, in some cases, the second inter-layer insulation layer 9 is not provided.

Second Embodiment

Figure 12:
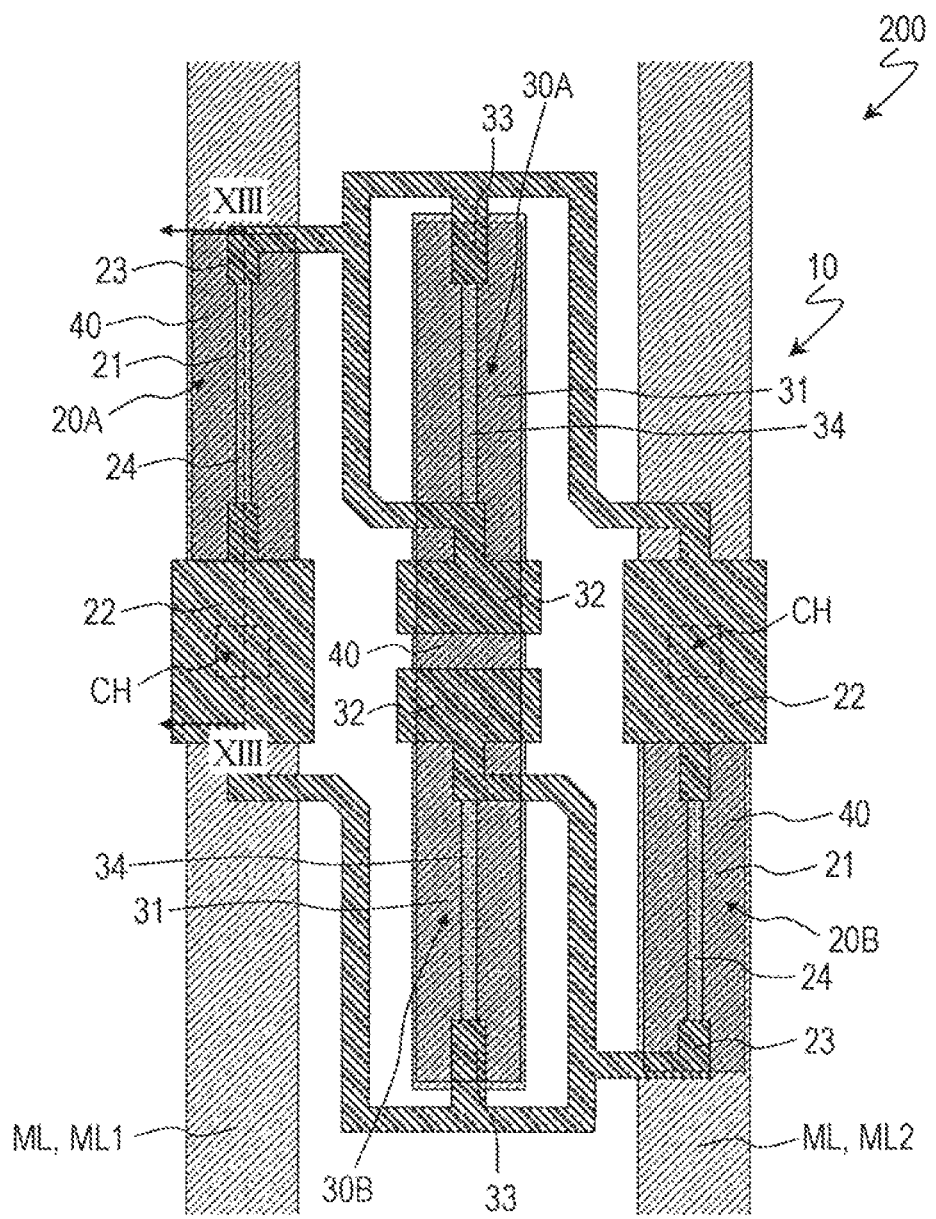
FIG. 12 is a diagram schematically illustrating the vicinity of an ESD protection circuit of an active matrix substrate according to an embodiment of the present disclosure.
Figure 13:
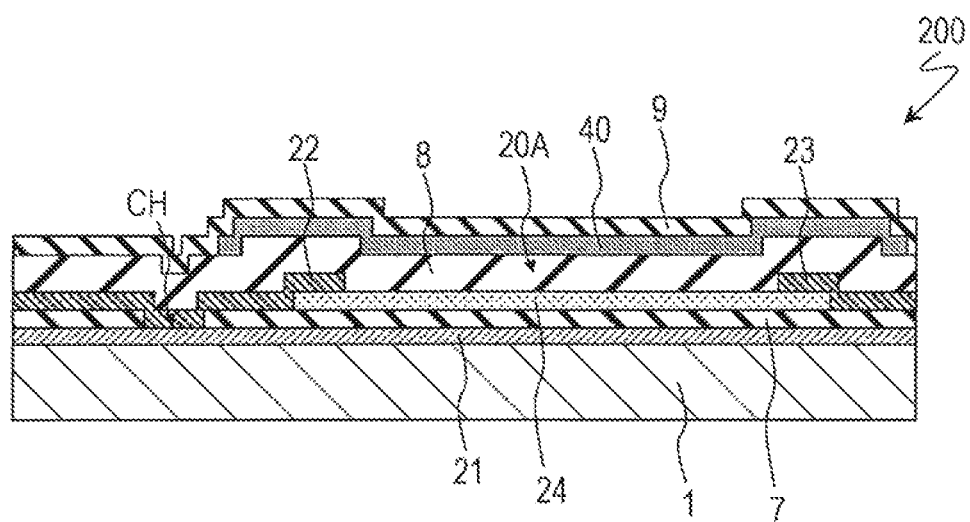
FIG. 13 is a cross-sectional diagram of the ESD protection circuit taken long line XIII-XIII in FIG. 12.

An active matrix substrate 200 according to the present embodiment is described with reference to FIGS. 12 and 13. FIG. 12 is a plan-view diagram illustrating the vicinity of the ESD protection circuit 10 of the active matrix substrate 200 according to the present embodiment. FIG. 13 is a cross-sectional diagram of the vicinity of the ESD protection circuit 10 taken long line XIII-XIII in FIG. 12.

The active matrix substrate 200, as illustrated in FIGS. 12 and 13, is different from the active matrix substrate 100 according to the first embodiment in that a light shielding layer 40 is further included.

The light shielding layer 40 overlaps the second semiconductor layer 24 of each of the diode elements 20A and 20B, and the third semiconductor layer 34 of each of the reserve diode structures 30A and 30B, when viewed from the direction normal to the substrate 1. Furthermore, the light shielding layer 40 is positioned in the opposite direction (more precisely, in the opposite direction to the first electrode 21 or the fourth electrode 31 and on a layer on an upper surface on each of the second semiconductor layer 24 and the third semiconductor layer 34) to the substrate 1 with respect to the second semiconductor layer 24 and the third semiconductor layer 34. In an example that is illustrated in FIG. 13, the light shielding layer 40 is formed on the first inter-layer insulation layer 8.

The active matrix substrate 200 according to the present embodiment includes the light shielding layer 40 as described above, and thus the diode characteristic shift can be kept from occurring due to the incidence of the external light on the second semiconductor layer 24 or the third semiconductor layer 34.

As described as in the first embodiment, with the black matrix that is formed on the opposite substrate, the diode characteristic shift can also be kept from, occurring due to the incidence of the external light on the second semiconductor layer 24 or the third semiconductor layer 34. However, as in the present embodiment, the active matrix substrate 200 includes the light shielding layer 40, and thus the ESD protection circuit 10 does not need to be positioned in a position that corresponds to the black matrix on the opposite substrate. For this reason, although in a position, that does not overlap the black matrix on the opposite substrate (furthermore, in a position that does not overlap the opposite substrate itself), the ESD protection circuit 10 can be positioned. Because of this, the freedom of a layout can be improved and frame-narrowing can be achieved.

Furthermore, in a case where the ESD protection circuit 10 is positioned in a position that overlaps the black matrix on the opposite substrate and the color filter and where the cutting process or the melting connection process that is accompanied by the illumination with the laser beam, there is a concern that light leakage will occur due to damage to the black matrix and the color filer or that a display defect will occur due to diffusion of a damaged member into the liquid crystal layer. When a configuration according to the present embodiment is employed, this secondary defect can be suppressed or avoided.

The light shielding layer 40, for example, is formed on the same layer as a metal wiring line for lowering resistivity of the common electrode 4 of the liquid crystal display device that operates in the FFS mode, or a wiring line for a touch panel of a display device into which a touch panel is built (more precisely, from, the same conductive film as these wiring lines), and thus the light shielding layer 40 can be provided without increasing the number of manufacturing processes. As a material of the light shielding layer 40, copper (Cu), aluminum (Al), titanium (Ti), molybdenum (Mo), or the like can be used. The light shielding layer 40 and a transparent electrode may be stacked one on top of another.

It is noted that as in the present embodiment, a configuration that includes the light shielding layer 40 may be applied to an active matrix substrate according to an embodiment, which will be described below.

Third Embodiment

Figure 14:
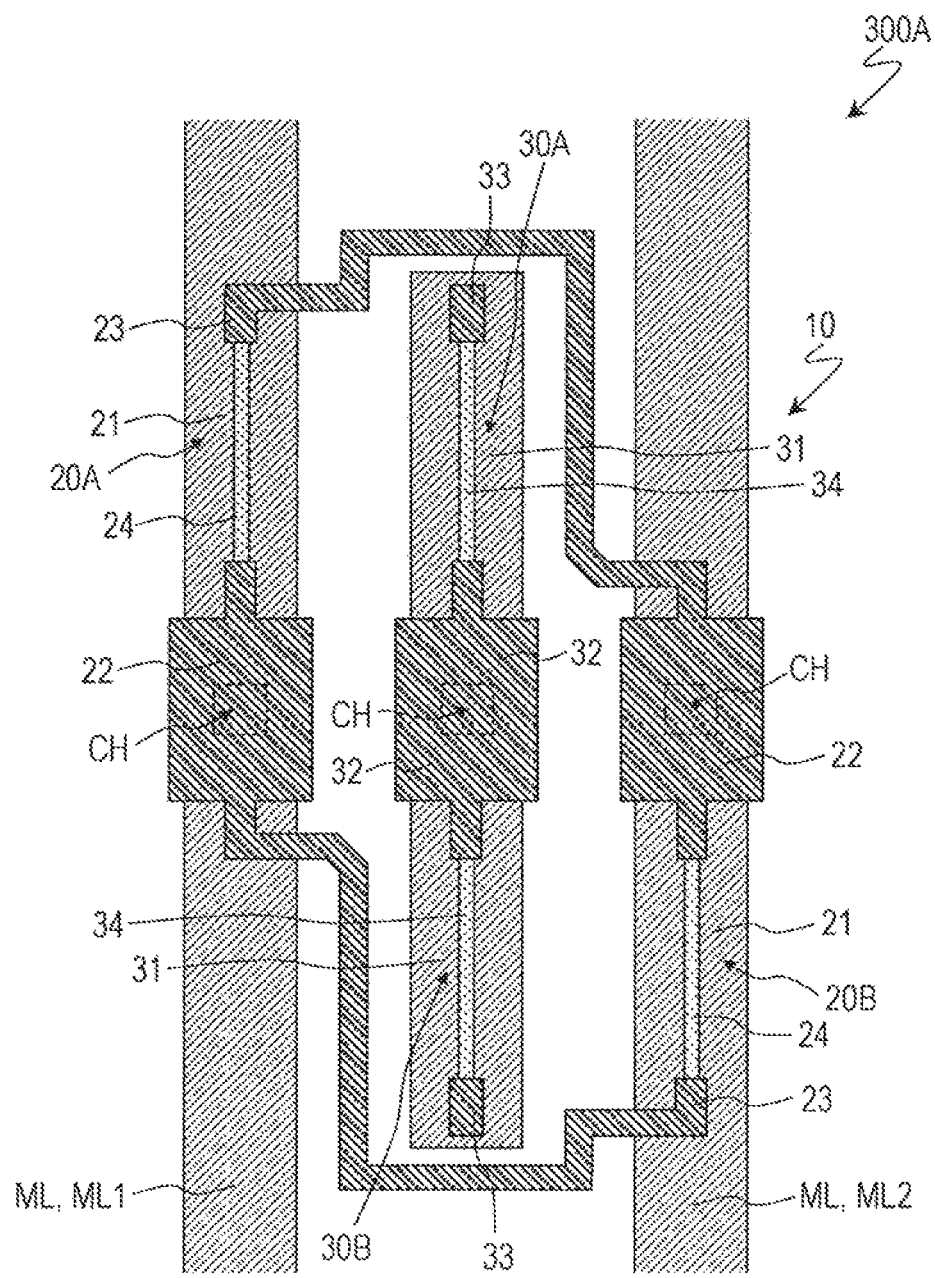
FIG. 14 is a diagram schematically illustrating the vicinity of an ESD protection circuit of an active matrix substrate according to an embodiment of the present disclosure.
Figure 15:
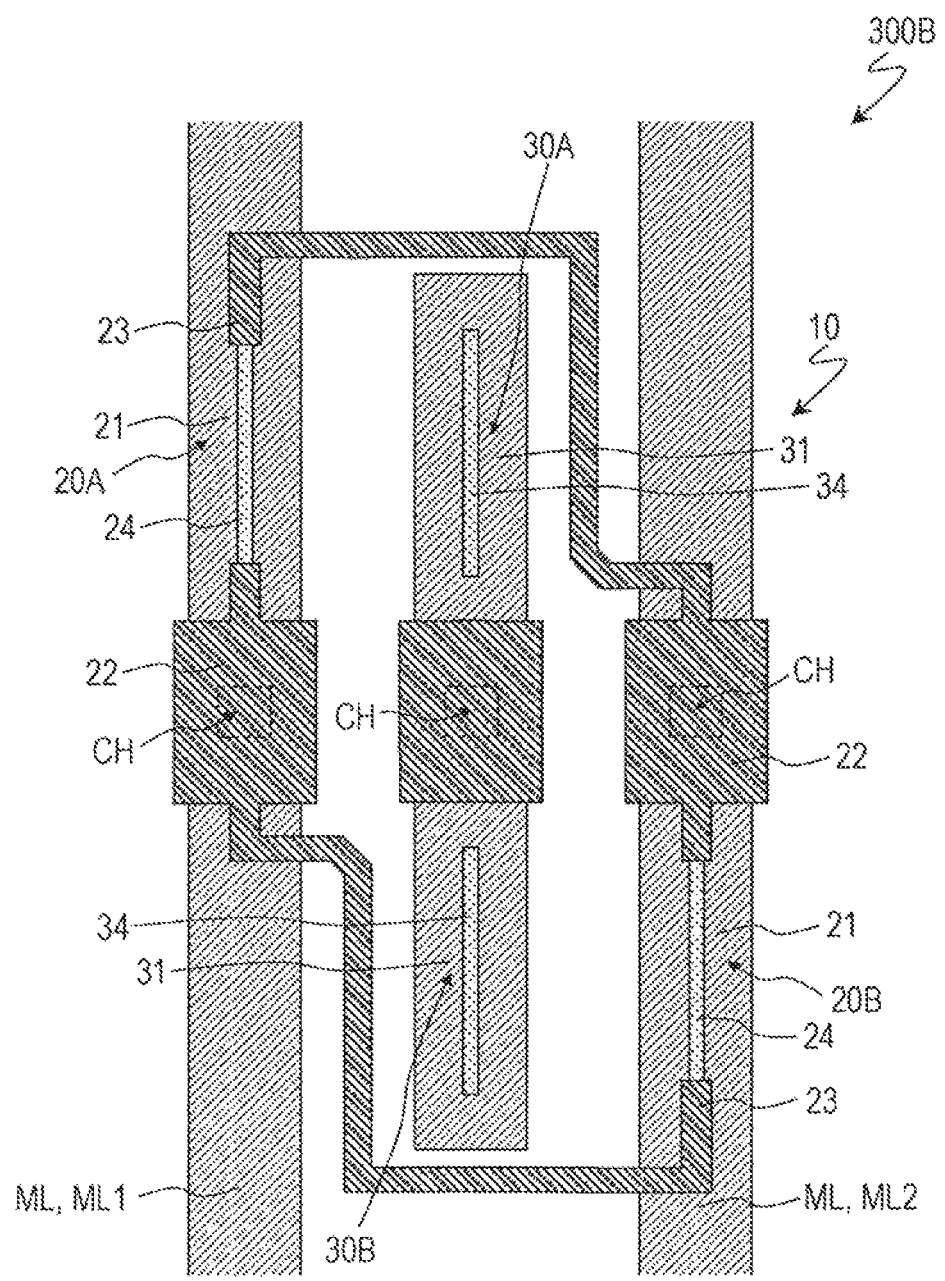
FIG. 15 is a diagram schematically illustrating the vicinity of an ESD protection circuit of an active matrix substrate according to an embodiment of the present disclosure.

Active matrix substrates 300A and 300B according to the present embodiment are described with reference to FIGS. 14 and 15. FIGS. 14 and 15 are plan-view diagrams illustrating the vicinities of the ESD protection circuits 10 of the active matrix substrates 300A and 300B, respectively.

In the active matrix substrates 300A and 300B that are illustrated in FIGS. 14 and 15, respectively, the reserve diode structures 30A and 30B of the ESD protection circuit 10 are not electrically connected to any of the first GDM wiring line ML1 and the second GDM wiring line ML2.

Furthermore, the reserve diode structures 30A and 30B are not electrically connected to any one of the diode elements 20A and 20B.

Moreover, in the active matrix substrate 300B that is illustrated in FIG. 15, the reserve diode structures 30A and 30B do not have the fifth electrode 32 and the sixth electrode 33 (more precisely, electrodes that are included in the source metal layer and are electrically connected to the third semiconductor layer 34), respectively.

In this manner, in the active matrix substrates 300A and 300B, the reserve diode structures 30A and 30B can be said to be electrically independent of the diode elements 20A and 20B.

In the active matrix substrates 300A and 300B according to the present embodiment, because the ESD protection circuit 10 has two diode elements, the diode elements 20A and 20B, a function of protecting the GDM circuit 5 is established.

Furthermore, in the active matrix substrates 300A and 300B according to the present embodiment, by making a small change to a mask pattern (specifically, by only making a change to a mask pattern dedicated for a source metal layer), a modification can be made to the ESD protection circuit 10 in such a manner that the same configuration (the bipartite diode ring) as that of the ESD protection circuit 910 that is a reference example which is illustrated in FIG. 10 is employed.

Figure 16:
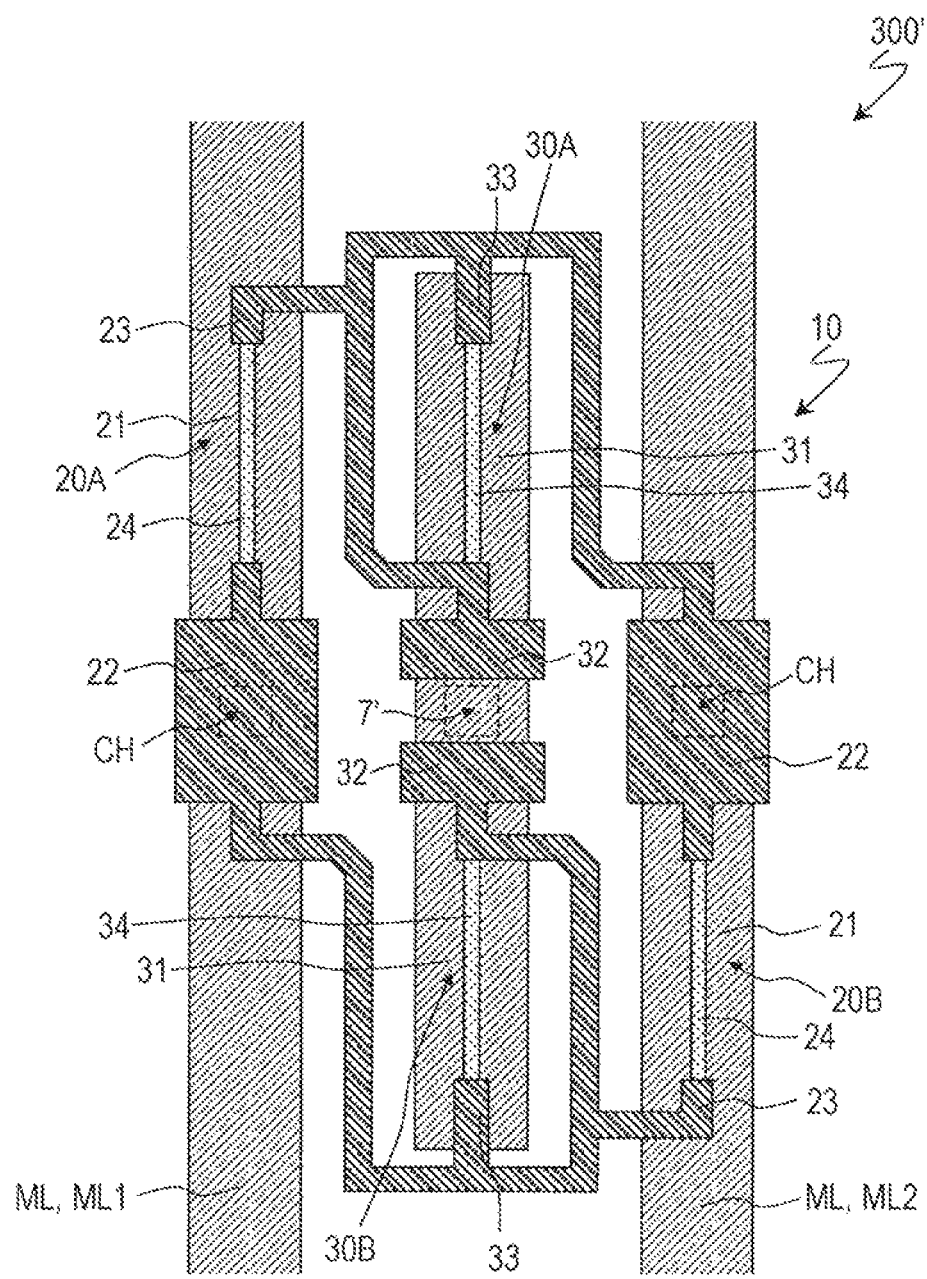
FIG. 16 is a diagram illustrating an active matrix substrate that is obtained by making a change to a mask pattern dedicated for only making a change to the mask pattern dedicated for a source metal layer and thus making a modification to the active matrix substrates.

Moreover, by making a small change to the mask pattern, a modification can be made to the active matrix substrates 300A and 300B in such a manner that the same configuration as in the first embodiment is employed. FIG. 16 illustrates an active matrix substrate 300' that is obtained by making a change to the mask pattern dedicated for only making a change to the mask pattern dedicated for the source metal layer and thus making a modification to the active matrix substrates 300A and 300B. With the same cutting process and melting connection process as for the reserve diode structures 30A and 30B according to the first embodiment, the reserve diode structures 30A and 30B of the active matrix substrate 300' that is illustrated in FIG. 16 can be caused to function as the diode elements. It is noted that, in a case where the mask pattern dedicated for the source metal layer is only changed, as illustrated in FIG. 16, an opening portion 7' (which is an opening portion for forming the contact hole CH) that is formed in the gate insulation layer 7 is present as is. Because of this, the fifth electrode 32 of each of the reserve diode structures 30A and 30B needs to be arranged in such a manner as not to overlap the opening portion 7'.

In this manner, it is possible that, only by only making a small change to the mask pattern (only by only making a change to the mask pattern dedicated for the source metal layer), a modification is made to the active matrix substrates 30A and 30B in such a manner that the same configuration as in the first embodiment and the reference example is employed. For this reason, for example, it is possible that measures to deal with the problem are taken at low cost, in a case where the problem described above (the problem due to the electrostatic discharge damage to the diode element of the ESD protection circuit) occurs as a result of changes in various specifications, such as an electrostatic breakdown voltage, a drive voltage of a drive, an optical film, and display quality, or in a case where a minor change model in which the specification described is changed.

Fourth Embodiment

An active matrix substrate 400 according to the present embodiment is described with reference to FIGS. 17 and 18.

Figure 17:
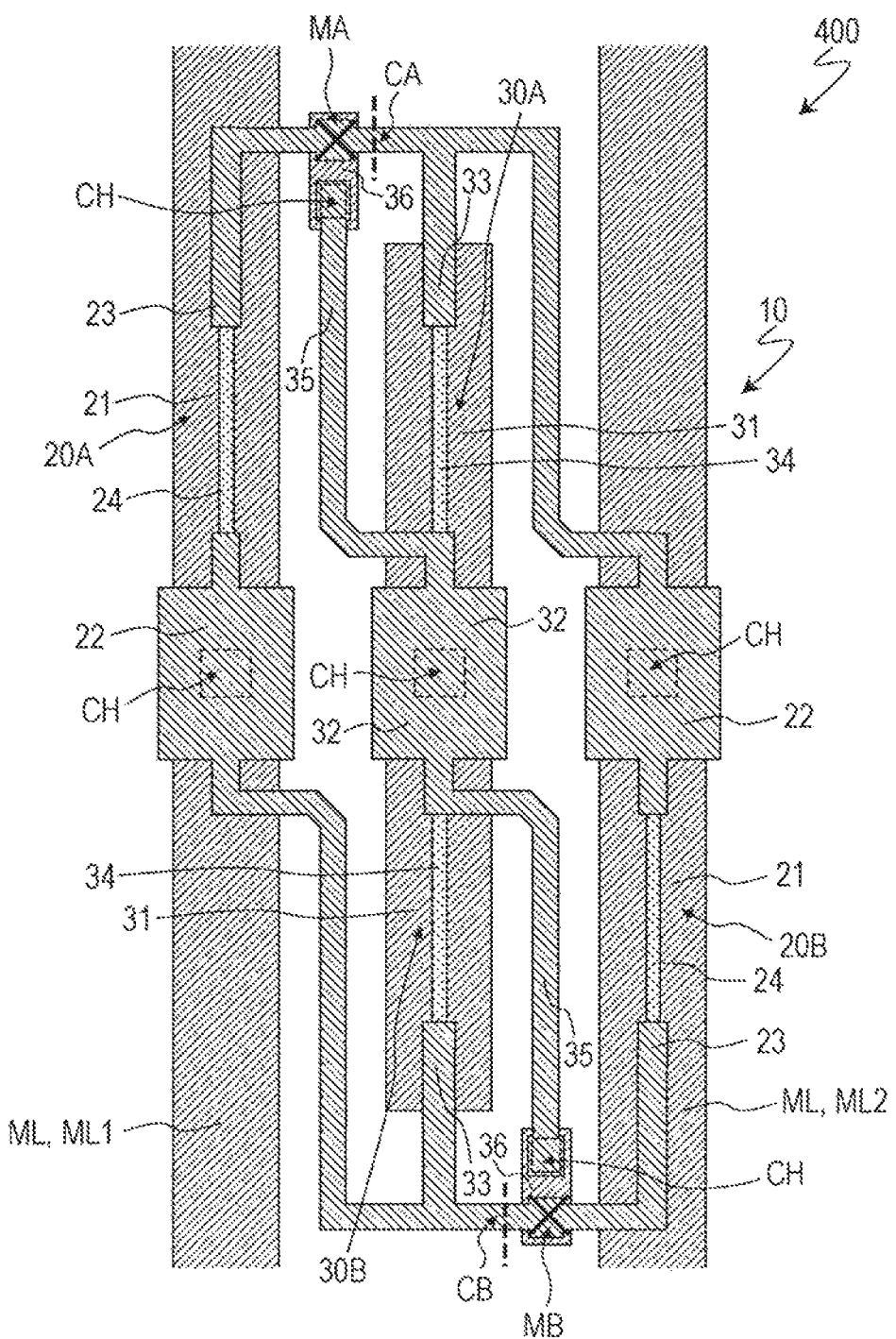
FIG. 17 is a diagram schematically illustrating the vicinity of the ESD protection circuit of an active matrix substrate according to an embodiment of the present disclosure.

FIG. 17 is a plan-view diagram illustrating the vicinity of the ESD protection circuit 10 of the active matrix substrate 400. FIG. 18 is a diagram of a circuit that is equivalent to the ESD protection circuit 10 of the active matrix substrate 400. In the following, what distinguishes the active matrix substrate 400 from, the active matrix substrate 100 according to the first embodiment is described in an emphasized manner.

Figure 18:
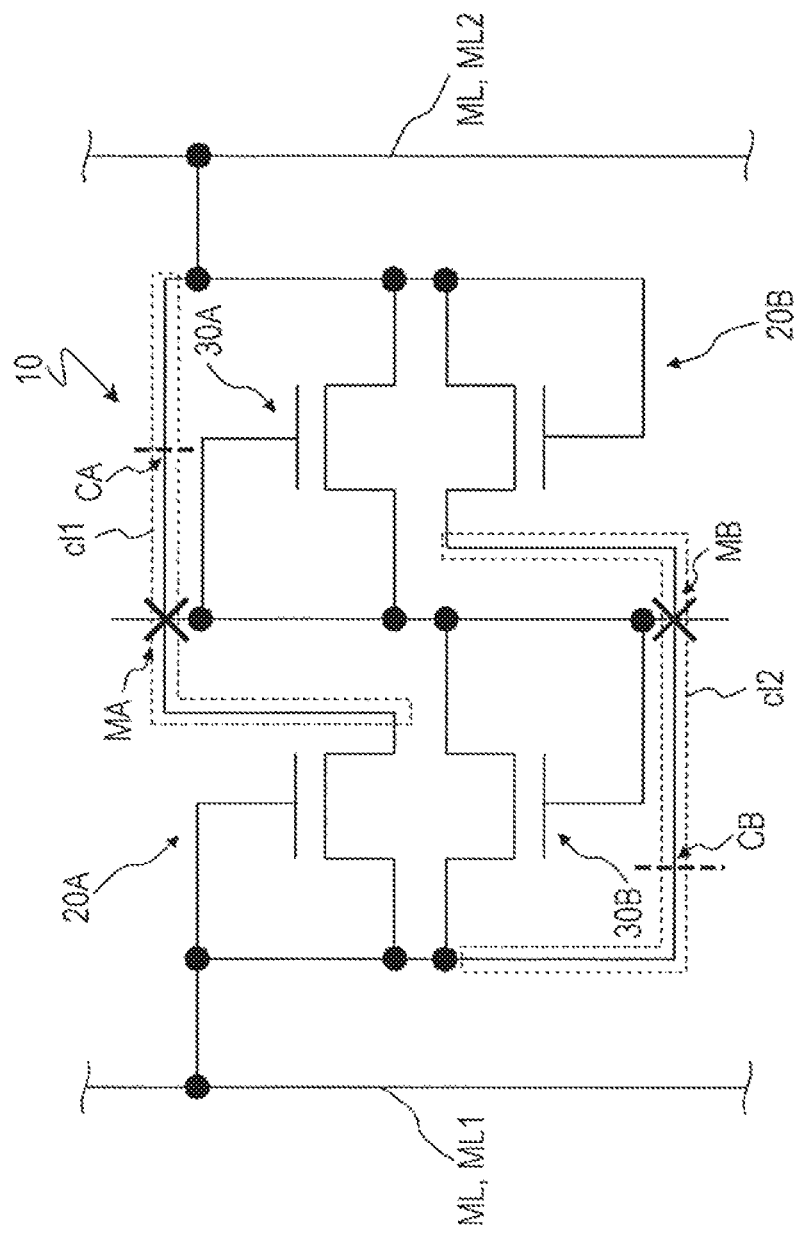
FIG. 18 is a diagram of a circuit that is equivalent to the ESD protection circuit 10 of the active matrix substrate.

In the active matrix substrate 400 according to the present embodiment, as illustrated in FIGS. 17 and 18, the fifth electrode 32 of the reserve diode structures 30A and 30B is electrically connected to the fourth electrode 31. Specifically, the fifth electrode 32 is connected to the fourth electrode 31, in the contact hole CH that is formed in the gate insulation layer 7.

Furthermore, the ESD protection circuit 10, as illustrated in FIG. 17, further includes the first connection electrode 35 and the second connection electrode 36 that correspond to the reserve diode structures 30A and 30B, respectively.

The first connection electrode 35 extends up to the fifth electrode 32. More precisely, the first connection electrode 35 is included in the source metal layer. The first connection electrode 35 includes a portion that does not overlap the fourth electrode 31 and the third semiconductor layer 34.

The second connection electrode 36 is included in the gate metal layer. More precisely, the second connection electrode 36 is formed on a layer that is separate from the first connection electrode 35. However, the second connection electrode 36 is electrically connected to the first connection electrode 35. Specifically, the second connection electrode 36 is connected to the first connection electrode 35, in the contact hole CH that is formed in the gate insulation layer 7.

The fifth electrode 32 of the first reserve diode structure 30A is not electrically connected to the first GDM wiring line ML1, and the sixth electrode 33 of the first reserve diode structure 30A is electrically connected to the second GDM wiring line ML2.

The fifth electrode 32 of the second reserve diode structure 30B is not electrically connected to the second GDM wiring line ML2, and the sixth electrode 33 of the second reserve diode structure 30B is electrically connected to the first GDM wiring line ML1.

The ESD protection circuit 10 includes the first connection wiring line cl1 for electrically connecting the third electrode 23 of the first diode element 20A and the second GDM wiring line ML2, and the second connection wiring line cl2 for electrically connecting the third electrode 23 of the second diode element 20B and the first GDM wiring line ML1.

The second connection electrode 36 that corresponds to the first reserve diode structure 30A at least partially corresponds to the first connection wiring line cl1 with the gate insulation layer 7 in between. Furthermore, the second connection electrode 36 that corresponds to the second reserve diode structure 30B at least partially overlaps the second connection wiring line cl2 with the gate insulation layer 7 in between.

In FIGS. 17 and 18, the cutting portions CA and CB in the cutting process and the melting portions MA and MB are illustrated. As illustrated in FIGS. 17 and 18, the melting portions MA and MB is a portion where the second connection electrode 36 of the first reserve diode structure 30A the first connection wiring line cl1 overlap, and a portion where the second connection electrode 36 of the second reserve diode structure 30B and the second connection wiring line cl2 overlap, respectively.

In the active matrix substrate 400 according to the present embodiment, the melting portions MA and MB can be positioned at a distance away from the reserve diode structures 30A and 30B, respectively. For this reason, the reserve diode structures 30A and 30B (more precisely, portions that function as the diode elements) do not need to be illuminated with the laser beam. For this reason, it is difficult for a secondary defect due to the illumination with the laser light to occur due.

Fifth Embodiment

Figure 19:
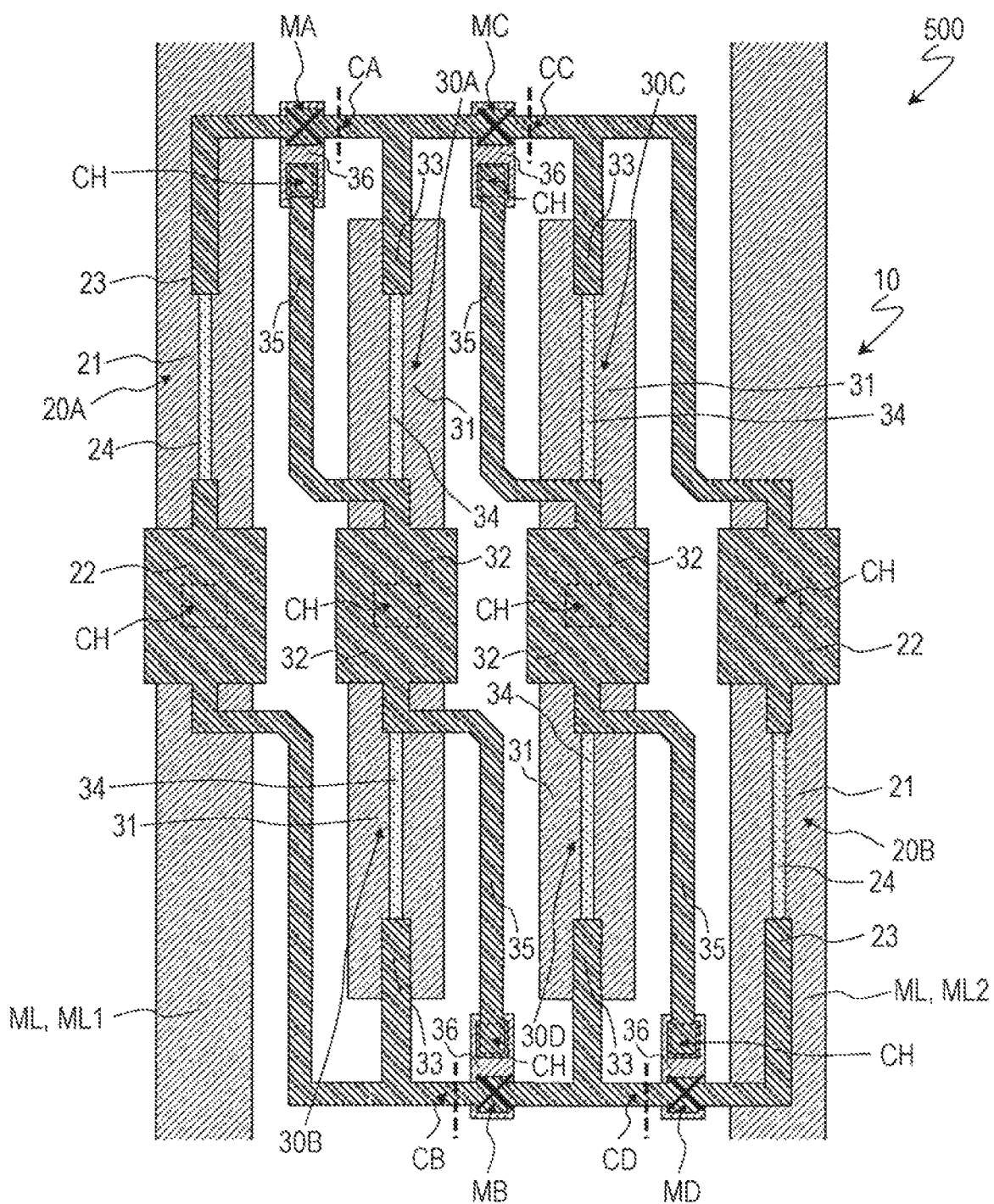
FIG. 19 is a diagram schematically illustrating the vicinity of the ESD protection circuit of an active matrix substrate according to an embodiment of the present disclosure.

An active matrix substrate 500 according to the present embodiment is described with reference to FIG. 19. FIG. 19 is a plan-view diagram illustrating the vicinity of the ESD protection circuit 10 of the active matrix substrate 500. In the following, what distinguishes the active matrix substrate 500 from the active matrix substrate 400 according to the fourth embodiment is described in an emphasized manner.

The active matrix substrate 500 according to the present embodiment is different from the active matrix substrate 400 according to the fourth embodiment, in that the ESD protection circuit 10 includes third reserve diode structures 30C and a fourth reserve diode structure 30D. More precisely, the ESD protection circuit 10 of the active matrix substrate 500 has four reserve diode structures, reserve diode structures 30A, 30B, 30C, and 30D. Moreover, in other words, the number of reserve diode structures that the ESD protection circuit 10 has is greater than the number of diode elements.

In an example that is illustrated, the third reserve diode structure 30C is connected to the first diode element 20A and the second diode element 20B in the same manner as the first reserve diode structure 30A. Furthermore, the fourth reserve diode structure 30D is connected to the first diode element 20A and the second diode element 20B in the same manner as the second reserve diode structure 30B.

In the active matrix substrate 500 according to the present embodiment, the number of reserve diode structures is greater than the number of diode elements. Because of this, the redundancy can be much more increased. For example, although the defect of the first diode element 20A is repaired by the cutting at the cutting portion CA and the melting connection between the melting portions MA and MB, there is a likelihood that the diode element that is obtained from the first reserve diode structure 30A will be defective (the resistivity will be low). In this case, by performing the cutting at the cutting portion CC and the melting connection between the melting portions MC and MD, the repair that uses the third reserve diode structure 30C can be performed. In the same manner, when the repair of the defect of the second diode element 20B is performed by the cutting at the cutting portion CB and the melting connection between the melting portions MA and MB, in a case where the diode element that is obtained from the second reserve diode structure SOB is defective (the resistance is low), the repair that uses the fourth reserve diode structure SOD can be performed by performing the cutting at the cutting portion CD and the melting connection between the melting portions MC and MD.

It is noted that the active matrix substrate 500 according to the present embodiment can be said to have the configuration that is obtained by the number of reserve diode structures of the active matrix substrate 400 according to the fourth embodiment, but in the active matrix substrates 100 and 200 according to the first and second embodiments, many more reserve diode structures than diode elements are also provided. Thus, the same effect can be obtained. Furthermore, in the active matrix substrates 300A and 300B according to the third embodiment, in a case where many more reserve diode structures than diode elements are also provided and thus where a modification (a modification to employ the configuration according to the first embodiment or the configuration of the reference example is made by changing the master pattern, an effect of further increasing the redundancy is obtained.

Sixth Embodiment

Figure 20:
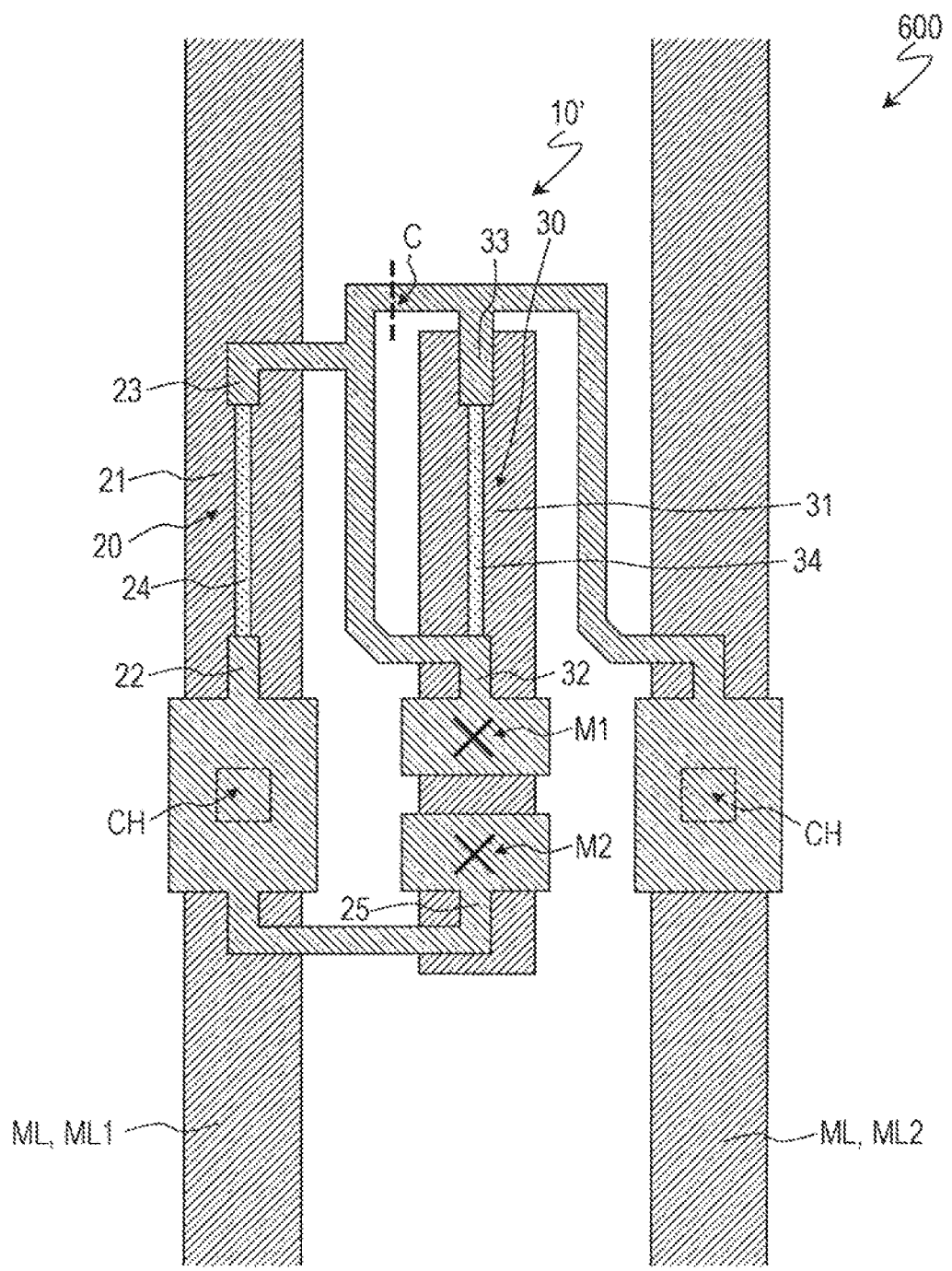
FIG. 20 is a diagram schematically illustrating the vicinity of an ESD protection circuit of an active matrix substrate according to an embodiment of the present disclosure.
Figure 21:
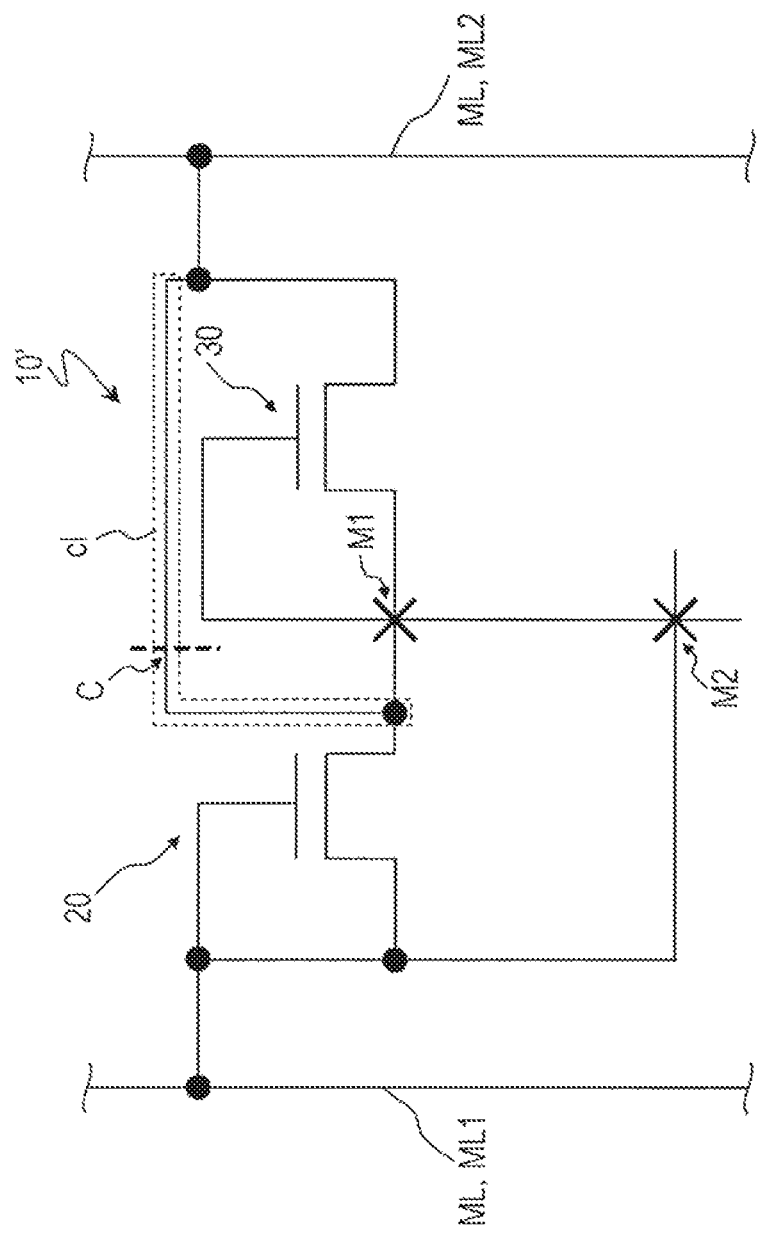
FIG. 21 is a diagram of a circuit that is equivalent to the ESD protection circuit 10 of the active matrix substrate.

An active matrix substrate 600 according to the present embodiment is described with reference to FIGS. 20 and 21. FIG. 20 is a plan-view diagram illustrating the vicinity of an ESD protection circuit 10' of the active matrix substrate 600. FIG. 21 is a diagram of a circuit that is equivalent to the ESD protection circuit 10' of the active matrix substrate 600.

The ESD protection circuit 10' that is included in the active matrix substrate 600 according to the present embodiment includes one diode element 20 and one reserve diode structure 30.

The diode element 20 is connected between two GDM wiring lines ML. Specifically, the first electrode 21 and the second electrode 22 of the diode element 20 is electrically connected to the first GDM wiring line ML1, and the third electrode 23 of the diode element 20 is electrically connected to the second GDM wiring line ML2.

The fourth electrode 31 of the reserve diode structure 30 is not electrically connected to any one of the fifth electrode 32 and the sixth electrode 33. The fifth electrode 32 at least partially overlaps the fourth electrode 31 with the gate insulation layer 7 in between.

The fifth electrode 32 of the reserve diode structure 30 is not electrically connected to the first GDM wiring line ML1, and the sixth electrode 33 is electrically connected to the second GDM wiring line ML2.

The ESD protection circuit 10' includes a connection wiring line cl that is electrically connected to the third electrode 23 of the diode element 20 and the second GDM wiring line ML2, and a connection electrode 25 that extends from the second electrode 22 of the diode element 20 and at least partially overlaps the fourth electrode 31 of the reserve diode structure 30 with the gate insulation layer 7 in between.

In the case of the active matrix substrate 600, defect repair can be performed as follows.

First, among the multiple ESD protection circuits 10, the ESD protection circuit 10 in which the diode element 20 is damaged due to the electrostatic discharge is specified (the specifying process).

Next, in the specified ESD protection circuit 10, the connection wiring line cl is cut by illuminating a prescribed portion (a cutting portion C) with the laser beam, (the cutting process).

Subsequently, in the specified ESD protection circuit 10, a portion (a melting portion) M1 where the fourth electrode 31 and the fifth electrode 32 of the reserve diode structure 30 overlap, and a portion (a melting portion) M2 where the fourth electrode 31 and the connection electrode 25 of the reserve diode structure 30 are illuminated with a laser beam LL. Thus, the fourth electrode 31 and the fifth electrode 32 are connected, and the fourth electrode 31 and the connection electrode 25 are connected (the melting connection process).

In this manner, in the active matrix substrate 600 according to the present embodiment, the defect repair that uses the reserve diode structure 30 can also be performed. Example of Application to Other Than the GDM Wiring Line In the description so far, the example in which the ESD protection circuit 10 (10') is connected between the GDM wiring lines ML is given, but the embodiments according to the present disclosure are not limited to this. The ESD protection circuit 10 (10') may be connected to between any other wiring lines. An example of application to other than the GDM wiring line ML will be described below with reference to FIGS. 22 to 25.

Figure 22:
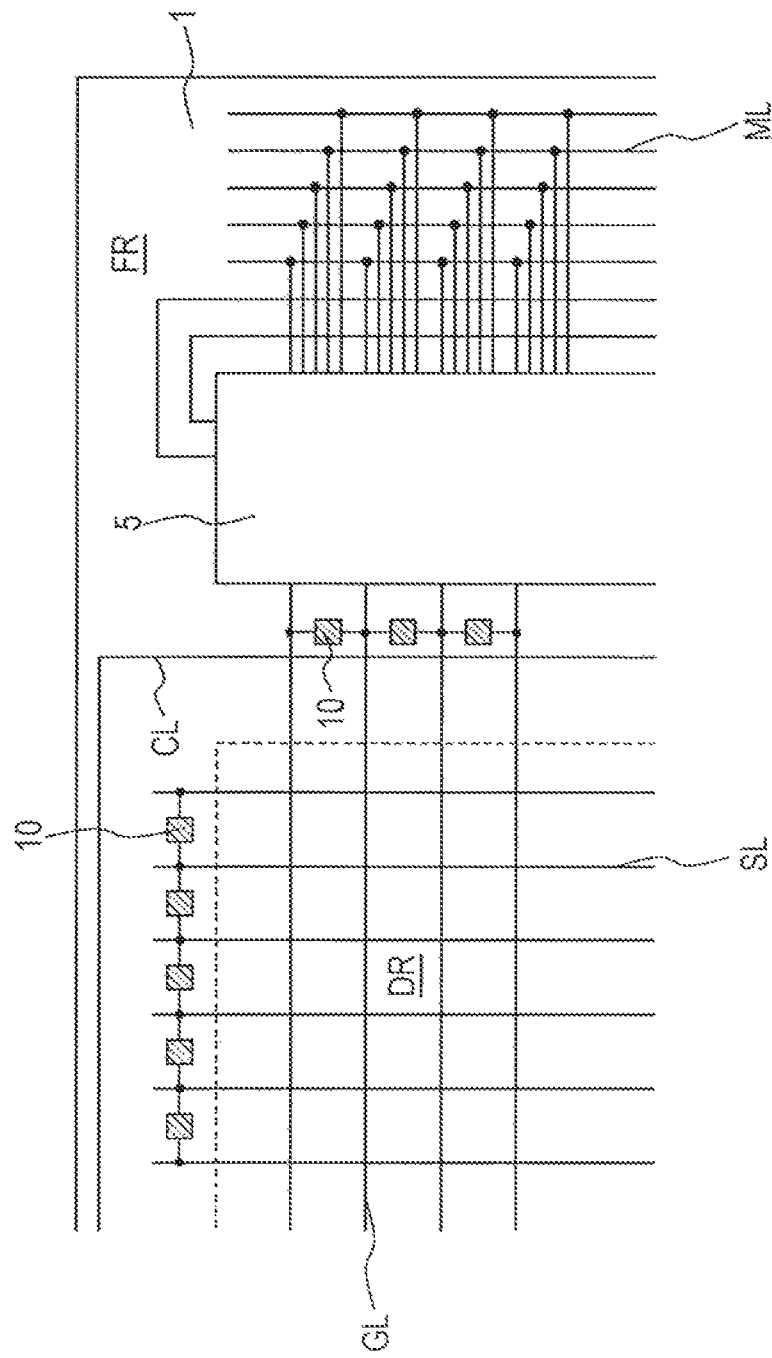
FIG. 22 is a diagram illustrating an example of application of the ESD protection circuit.

In an example that is illustrated in FIG. 22, not only is the ESD protection circuit 10 provided between the gate wiring lines GL, but the ESD protection circuit 10 is also provided between the source wiring lines SL. The ESD protection circuit 10 is provided between the gate wiring lines GL or between the source wiring lines SL, and thus the electrostatic discharge damage is kept from occurring to a pixel circuit (the pixel TFT 2).

Figure 23:
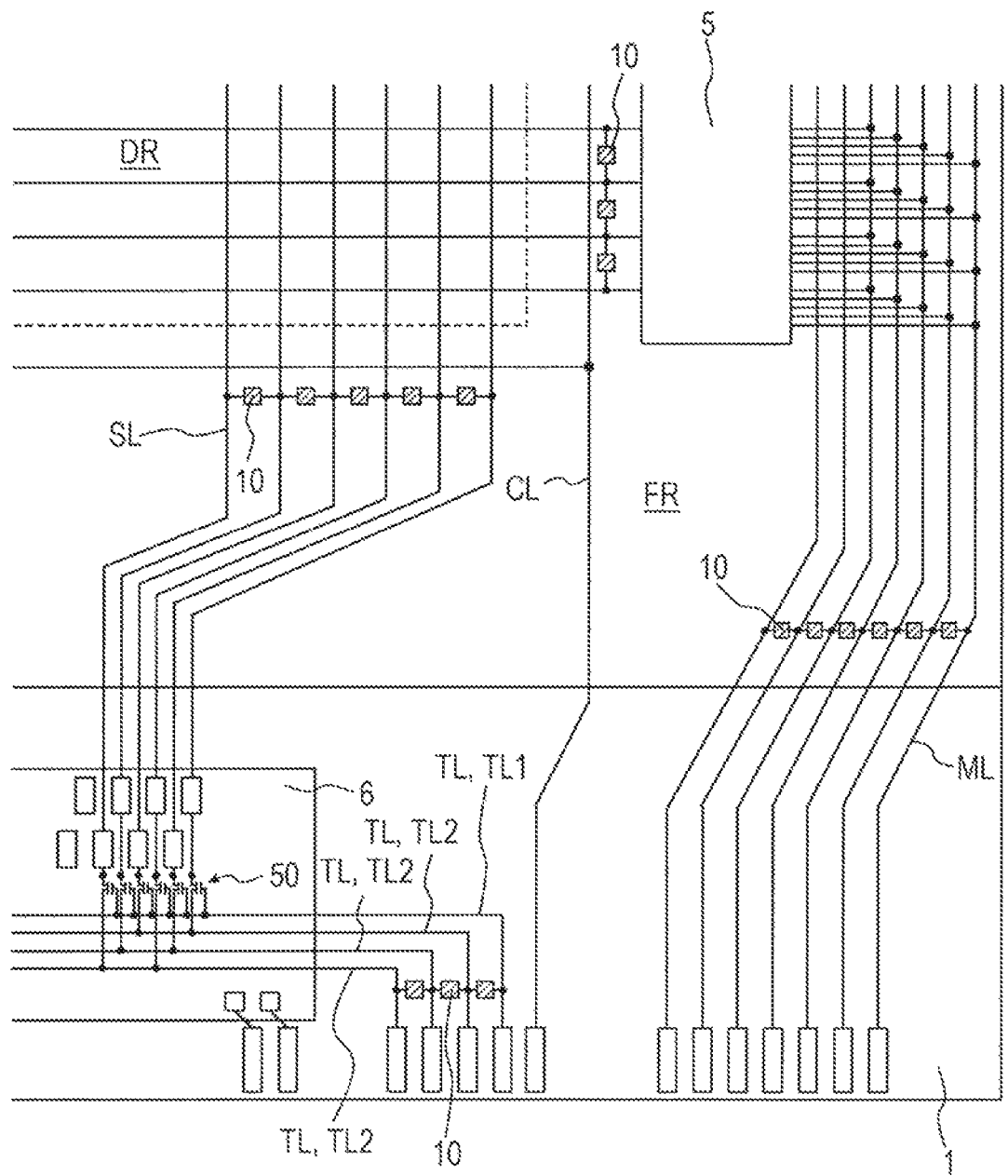
FIG. 23 is a diagram illustrating an example of the application of the ESD protection circuit.

In an example that is illustrated in FIG. 23, multiple inspection TFTs 50 and multiple inspection wiring lines TL that supplied a signal to the multiple inspection TFTs 50 are provided in the peripheral area FR, and the ESD protection circuit 10 is also provided within the inspection wiring lines TL.

Multiple inspection wiring lines TL includes an inspection gate wiring line TL1 and an inspection source wiring line TL2. A gate electrode of the inspection TFT 50 is electrically connected to the inspection gate wiring line TL1. A source electrode of the inspection TFT 50 is electrically connected to the inspection source wiring line TL2. A drain electrode of the inspection TFT 50 is electrically connected to any one of the multiple source wiring lines SL.

The ESD protection circuit 10 is provided between the inspection wiring lines TL, and thus the electrostatic discharge damage is kept from occurring to the inspection TFT 50.

It is noted that it is preferable that because an area in which the inspection wiring line TL is provided does not face the opposite substrate, a configuration that includes the light shielding layer 40 as in the second embodiment is employed.

Figure 24:
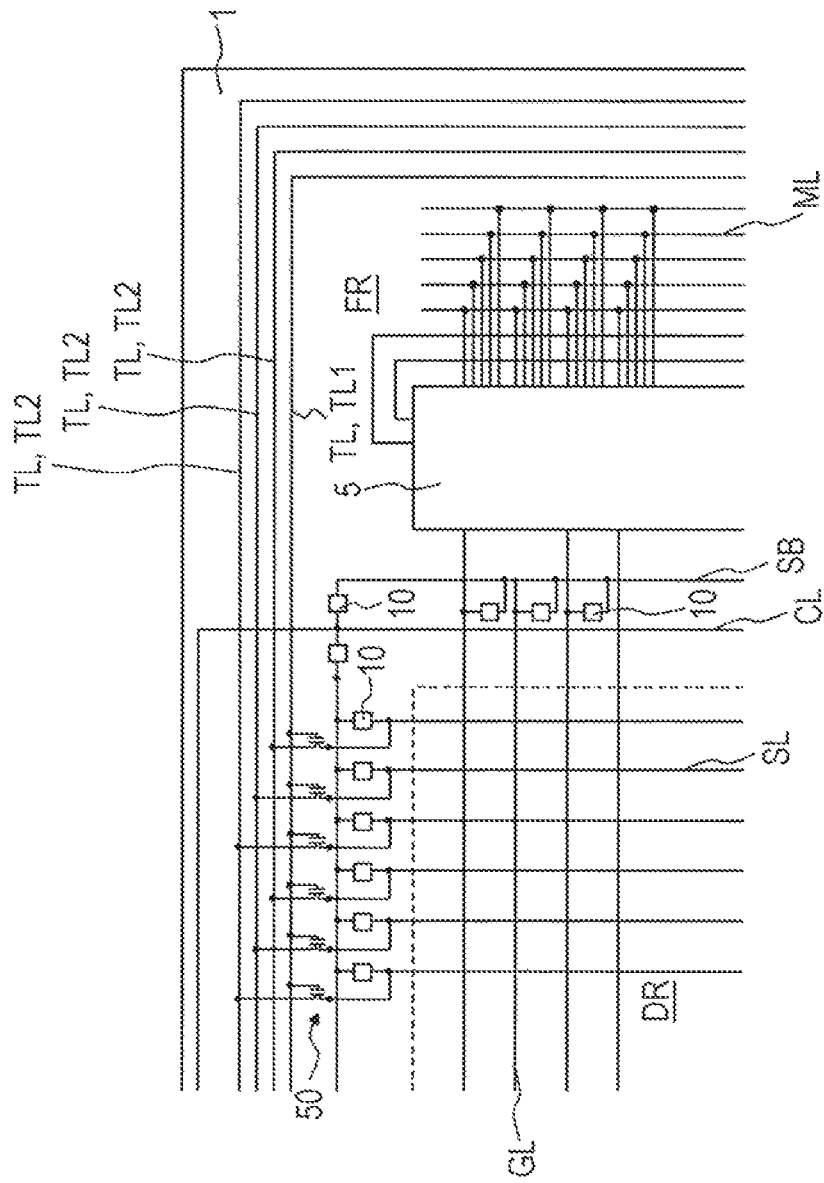
FIG. 24 is a diagram illustrating an example of the application of the ESD protection circuit.
Figure 25:
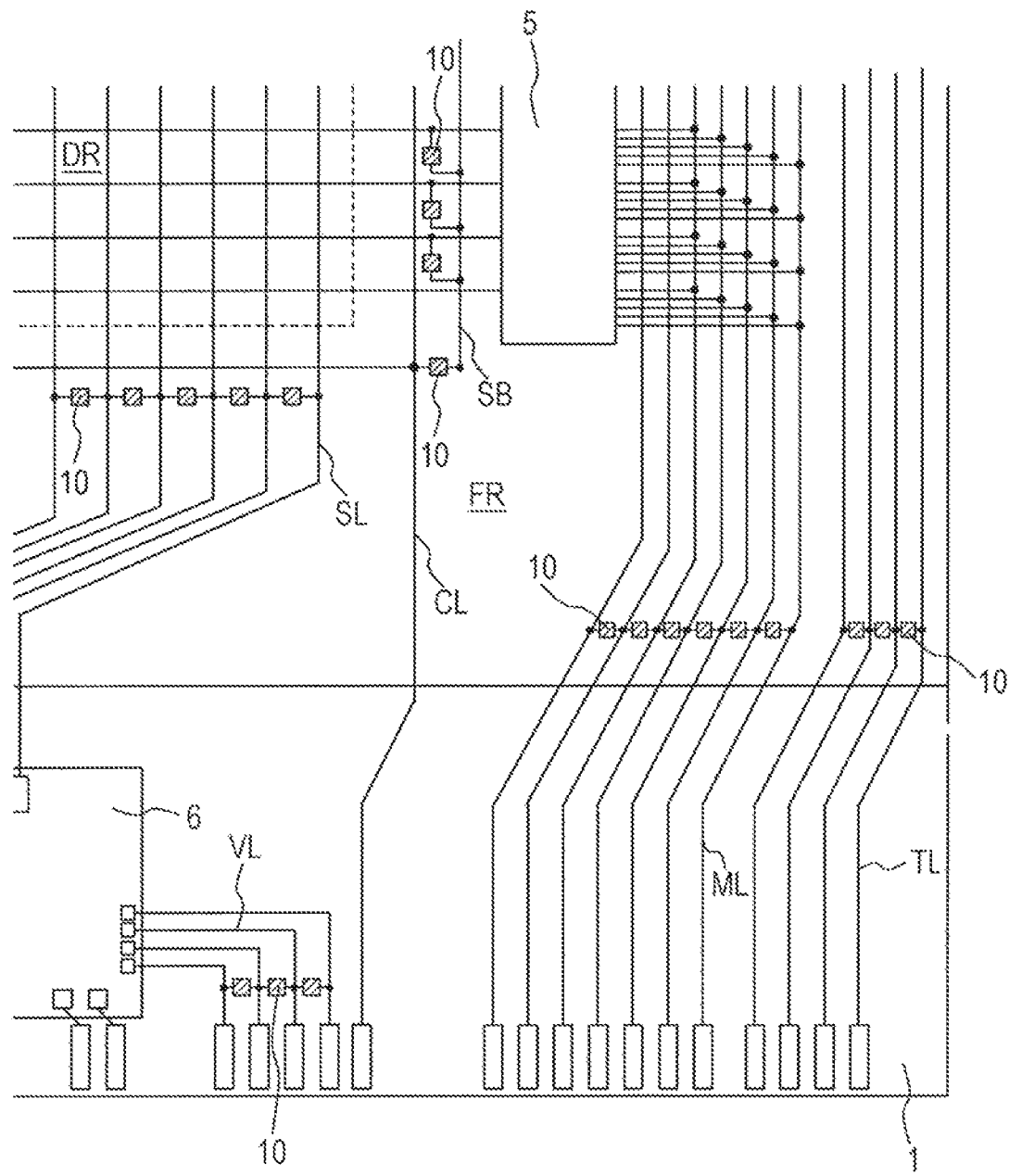
FIG. 25 is a diagram illustrating an example of the application of the ESD protection circuit.

In an example that is illustrated in FIG. 24, a common line (a short bar) SB is provided in the peripheral area FR in such a manner as to encompass the display area DR. The ESD protection circuit 10 is provided between the gate wiring line GL and the short bar SB, between the source wiring line SL and the short bar SB, and between the common wiring line CL and the short bar SB. In an example that is illustrated in FIG. 25, the ESD protection circuit 10 is provided between power source wiring lines VL that are connected to the source driver 6.

In this manner, the ESD protection circuit 10 is provided between each of wiring lines, and thus a decrease or the like in the display quality due to the ESD can be suppressed.

Oxide Semiconductor

An oxide semiconductor that is included in an oxide semiconductor layer may be an amorphous oxide semiconductor and may be a crystalline oxide semiconductor that has a crystalline portion. As the crystalline oxide semiconductor, a polycrystalline oxide semiconductor, a microcrystalline oxide semiconductor, a crystalline oxide semiconductor in which a c-axis aligns approximately vertically with a layer surface, or the like is given.

The oxide semiconductor layer may have a two- or greater-layered structure. In a case where the oxide semiconductor layer has a multi-layered structure, the oxide semiconductor layer may include a non-crystalline oxide semiconductor layer and a crystalline oxide semiconductor layer. Alternatively, the oxide semiconductor layer may include multiple crystalline oxide semiconductor layers that have different crystal structures. Furthermore, the oxide semiconductor layer may include multiple non-crystalline oxide semiconductor layers. In a case where the oxide semiconductor layer has a two-layered structure in which an upper layer and a lower layer are included, it is preferable that an energy gap of an oxide semiconductor that is contained in the upper layer is set to be greater than an energy gap of an oxide semiconductor that is contained in the lower layer. However, in a case where a difference in the energy gap between the upper and lower layers is comparatively small, the energy gap of the oxide semiconductor in the lower layer may be set to be greater than the energy gap of the oxide semiconductor in the upper layer.

Materials and structures of the non-crystalline oxide semiconductor and each of the crystalline oxide semiconductors described above, a film formation method, a structure of the oxide semiconductor that has a multi-layered structure, and the like, for example, are described in Japanese Unexamined Patent Application No. 2014-007399. For reference, the entire contents of Japanese Unexamined Patent Application Publication No. 2014-007399 are incorporated in the present specification by reference.

The oxide semiconductor layer, for example, may include at least one type of metal element among In, Ga, and Zn. In the present embodiment, the oxide semiconductor layer, for example, contains an In—Ga—Zn—O-based semiconductor (for example, oxide indium gallium zinc). The In—Ga—Zn—O-based semiconductor here is a ternary oxide material that consists of Indium (In), Gallium (Ga), and Zinc (Zn). A ratio (a composition ratio) among In, Ga, and Zn is not particularly limited. Examples of the ratio include In:Ga:Zn=2:2:1, In:Ga:Zn=1:1:1, In:Ga:Zn=1:1:2, and the like. This oxide semiconductor layer can be formed from an oxide semiconductor layer that contains an In—Ga—Zn—O-based semiconductor. It is noted that, in some cases, a channel etch type TFT that has an activation layer which contains an oxide semiconductor, such as In—Ga—Zn—O-based semiconductor, is referred to as "CE-OS-TFT".

The In—Ga—Zn—O-based semiconductor may be amorphous and may be crystalline. A crystalline in—Ga—Zn—O-based semiconductor in which a c-axis aligns approximately vertically with a layer surface is preferable as a crystalline In—Ga—Zn—O-based semiconductor.

It is noted that a crystal structure of the crystalline In—Ga—Zn—O-based semiconductor, for example, is disclosed in Japanese Unexamined Patent Application Publication Nos. 2014-007399, 2012-134475, and 2014-209727, which are described above, and other publications. For reference, the entire contents of Japanese Unexamined Patent present Nos. 2012-134475 and 2014-209727 are incorporated in the present specification by reference. A TFT that has an In—Ga—Zn—O-based semiconductor layer has high mobility (which is more than 20 times higher than that of an a-Si TFT) and a small amount of leak current (which is less than one-hundredth of that of the a-Si TFT). Because of this, the TFT is suitably used as a drive TFT (for example, a TFT that is included in a drive circuit which is provided on the same substrate as a display area, in the vicinity of the display area that includes multiple pixels) and a pixel TFT (a TFT that is provided in a pixel).

The oxide semiconductor layer may contain any other oxide semiconductor instead of the In—Ga—Zn—O-based semiconductor. For example, an In—Sn—Zn—O-based semiconductor (for example, $In_2O_3$—$SnO_2$—ZnO; InSn-ZnO) may be contained. The In—Sn—Zn—O-based semiconductor is a ternary oxide material that consists of Indium (In), Tin (Sn), and Zinc (Zn). Alternatively, an oxide semiconductor layer 2a may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, Cadmium oxide (CdO), a Mg—Zn—O-based semiconductor, an In—Ga—Sn—O-based semiconductor, an In—Ga—O-based semiconductor, a Zr—In—Zn—O-based semiconductor, or a Hf—In—Zn—O-based semiconductor.

It is noted that the oxide semiconductor TFT may be a "channel etch type TFT", and may be a "etch stop type TFT".

Figure 26:
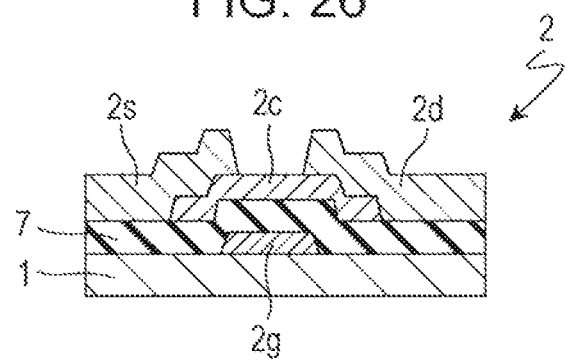
FIG. 26 is a diagram illustrating an example of a channel etch type TFT.

FIG. 26 illustrates an example of the channel etch type TFT. A TFT 2 that is illustrated in FIG. 26 has a gate electrode 2g, the gate insulation layer 7 that covers the gate electrode 2g, an oxide semiconductor layer 2c that is provided on the gate insulation layer 7, and a source electrode 2s and a drain electrode 2d that are electrically connected to the oxide semiconductor layer 2c.

In the channel etch type TFT 2, for example, as illustrated in FIG. 3, an etch stop layer is not formed on a channel region, and end portion lower surfaces facing toward a channel, of source and drain electrodes are arranged in such a manner as to be brought into contact with an upper surface of the oxide semiconductor layer. For example, a conductive film for the source and drain electrodes is formed on the oxide semiconductor layer, and separation of a source and a drain is performed. Thus, the channel etch type TFT is formed. In some cases, in a process of separating the source and the drain, a surface portion of the channel region is etched.

On the other hand, in a TFT (an etch stop type TFT) in which the etch stop layer is formed on the channel region, the end portion lower surfaces facing toward the channel, of the source and drain electrodes, for example, are arranged are positioned on the etch stop layer. For example, the etch stop layer that covers a portion that is the channel region, of the oxide semiconductor layer is formed, and then the conductive film for the source and drain electrodes is formed on the oxide semiconductor layer and the etch stop layer and the separation of the source and the drain is performed. Thus, the etch stop type TFT is formed.

It is noted that the case where the oxide semiconductor TFT is of a bottom gate type is described above as an example, but that the oxide semiconductor TFT may be of a top gate type. Furthermore, a TFT other than the oxide semiconductor TFT may be used as the TFT.

According to the embodiments of the present disclosure, the display quality or the like can be suitably kept from decreasing due to the damage to, or characteristic shift of, the diode element of the ESD protection circuit that is provided on the active matrix substrate.

The present disclosure contains subject matter related to that disclosed in Japanese Priority Patent Application JP 2018-078206 filed in the Japan Patent Office on Apr. 16, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising:
a substrate;
multiple wiring lines that include multiple gate wiring lines and multiple source wiring lines, the multiple wiring lines being provided in the substrate;
multiple thin film transistors each of which has a gate electrode, a source electrode, a drain electrode, and a first semiconductor layer, the multiple thin film transistors being supported on the substrate;
multiple ESD protection circuits each of which is electrically connected to two wiring lines, among the multiple wiring lines;
a gate metal layer that includes the multiple gate wiring lines and the gate electrodes of the multiple thin film transistors; and
a source metal layer that includes the multiple source wiring lines and the source electrodes and the drain electrodes of the multiple thin film transistors,
wherein each of the multiple EDS protection circuits includes at least one or more diode element,
wherein each of the at least one or more diode elements includes
a first electrode that is included in the gate metal layer,
a second semiconductor layer that is formed on the same layer as the first semiconductor layer and at least partially overlaps the first electrode with an insulation layer in between, and
a second electrode and a third electrode that are electrically connected to the second semiconductor layer, the second electrode and the third electrode being included in the source metal layer,
wherein the first electrode and the second electrode of the at least one or more diode elements are electrically connected to each other,
wherein each of the multiple ESD protection circuits further includes at least one or more reserve diode structures, and
wherein each of the at least one or more reserve diode structures includes
a fourth electrode that is in an electrically floating state, the fourth electrode being included in the gate metal layer, and
a third semiconductor layer that is formed on the same layer as the first semiconductor layer and the second semiconductor layer and at least partially overlaps the fourth electrode with the insulation layer in between.

2. The active matrix substrate according to claim 1, wherein each of the at least one or more reserve diode structures further includes a fifth electrode and a sixth electrode that are electrically connected to the third semiconductor layer, the fifth electrode and the sixth electrode being included in the source metal layer.

3. The active matrix substrate according to claim 1 wherein the at least one or more diode elements are two diode elements that are connected in parallel in such a manner that forward directions are opposite to each other between the two wiring lines, and
wherein the at least one or more reserve diode structures are two reserve diode structures.

4. The active matrix substrate according to claim 3, wherein, when the two wiring lines are defined a first wiring line and a second wiring line, respectively and the two diode elements are defined as a first diode element and a second diode element, respectively, the first electrode and the second electrode of the first diode element are electrically connected to the first wiring line, and the third electrode of the first diode element is electrically connected to the second wiring line, and the first electrode and the second electrode of the second diode element are electrically connected to the second wiring line, and the third electrode of the second diode element is electrically connected to the first wiring line.

5. The active matrix substrate according to claim 4, wherein the two reserve diode structures further include a fifth electrode and a sixth electrode that are electrically connected to the third semiconductor layer, respectively, the fifth electrode and the sixth electrode being included in the source metal layer, wherein the fourth electrode is not electrically connected to any one of the fifth electrode and the sixth electrode, wherein the fifth electrode at least partially overlaps the fourth electrode with the insulation layer in between, wherein, when the two reserve diode structures are defined as a first reserve diode structure and a second reserve structure, respectively, the fifth electrode of the first reserve diode structure is electrically connected to the third electrode of the first diode element, and the sixth electrode of the first reserve diode structure is electrically connected to the second wiring line, and the fifth electrode of the second reserve diode structure is electrically connected to the third electrode of the second diode element, and the sixth electrode of the second reserve diode structure is electrically connected to the first wiring line, and wherein each of the multiple ESD protection circuits includes a first connection wiring line for electrically connecting the third electrode of the first diode element and the second wiring line, and a second connection wiring line for electrically connecting the third element of the second diode element and the first wiring line.

6. The active matrix substrate according to claim 4, wherein the two reserve diode structures include a fifth electrode and a sixth electrode that are electrically connected to the third semiconductor layer, respectively, the fifth electrode and the sixth electrode being included in the source metal layer wherein the fifth electrode is electrically connected to the fourth electrode, wherein each of the multiple ESD protection circuits further includes a first connection electrode which includes a portion that does not overlap the fourth electrode and the third semiconductor electrode, the first connection electrode extending from the fifth electrode of each of the two reserve diode structures, wherein, when the two reserve diode structures are defined as a first reserve diode structure and a second reserve structure, respectively, the fifth electrode of the first reserve diode structure is not electrically connected to the first wiring line, and the sixth electrode of the first reserve diode structure is electrically connected to the second wiring line, and the fifth electrode of the second reserve diode structure is not electrically connected to the second wiring line, and the sixth electrode of the second reserve diode structure is electrically connected to the first wiring line, and wherein each of the multiple ESD protection circuits includes a first connection wiring line for electrically connecting the third electrode of the first diode element and the second wiring line, and a second connection wiring line for electrically connecting the third element of the second diode element and the first wiring line.

7. The active matrix substrate according to claim 6, wherein each of the multiple ESD protection circuits further includes a second connection electrode that is electrically connected to the first connection electrode, the second connection electrode being included in the gate metal layer, wherein the second connection electrode, which is connected to the first connection electrode that extends from the fifth electrode of the first reserve diode structure, at least partially overlaps the first connection wire line with the insulation layer in between, and wherein the second connection electrode, which is connected to the first connection electrode that extends from the fifth electrode of the second reserve diode structure, at least partially overlaps the second connection wire line with the insulation layer in between.

8. The active matrix substrate according to claim 1 wherein the at least one or more diode elements are one diode element that is connected between the two wiring lines, and wherein the at least one or more reserve diode structures are one reserve diode structure.

9. The active matrix substrate according to claim 8, wherein, when the two wiring lines are defined a first wiring line and a second wiring line, respectively, the first electrode and the second electrode of the diode element are electrically connected to the first wiring line, and the third electrode of the diode element is electrically connected to the second wiring line.

10. The active matrix substrate according to claim 9, further comprising:

wherein the reserve diode structure further includes a fifth electrode and a sixth electrode that are electrically connected to the third semiconductor layer, the fifth electrode and the sixth electrode being included in the source metal layer, wherein the fourth electrode is not electrically connected to any one of the fifth electrode and the sixth electrode, wherein the fifth electrode at least partially overlaps the fourth electrode with the insulation layer in between, wherein the fifth electrode of the reserve diode structure is not electrically connected to the first wiring line, and the sixth electrode of the reserve diode structure is electrically connected to the second wiring line, and wherein each of the multiple ESD protection circuits includes a connection wiring line that electrically connects the third electrode of the diode element and the second wiring line, and a connection electrode that extends from the second electrode of the diode element, and at least partially overlaps the fourth electrode of the reserve diode structure with the insulation layer in between.

11. The active matrix substrate according to claim 1, wherein the number of the at least one or more reserve diode structures is greater than the number of the at least one or more diode elements.

12. The active matrix substrate according to claim 1, further comprising:

a light shielding layer that is positioned in the opposite position to the first electrode and the fourth electrode with respect to the second semiconductor layer and the third semiconductor layer, the light shielding layer overlapping the second semiconductor layer and the third semiconductor layer when viewed from a direction normal to the substrate.

13. The active matrix substrate according to claim 1, wherein each of the first semiconductor layer, the second semiconductor layer, and the third semiconductor layer is an oxide semiconductor layer.

14. The active matrix substrate according to claim 13, wherein the oxide semiconductor layer contains an In—Ga—Zn—O-based semiconductor.

15. The active matrix substrate according to claim 14, wherein the In—Ga—Zn—O-based semiconductor contains a crystalline portion.

16. A display device comprising:
the active matrix substrate according to claim 1.

17. A method of repairing a detect of the active matrix substrate according to claim 5, the method comprising:
specifying an ESD protection circuit in which at least one of the two diode elements is damaged due to electrostatic discharge, among the multiple ESD protection circuits;
cutting at least one of the first connection wiring line and the second connection wiring line by illuminating a prescribed portion with a laser beam, in the specified ESD protection circuit; and
connecting the fourth electrode and the fifth electrode by illuminating a portion where the fourth electrode and the fifth electrode of each of the two reserve diode structures overlap, with the laser beam, in the specified ESD protection circuit.

18. A method of repairing a defect of the active matrix substrate according to claim 7, the method comprising:
specifying an ESD protection circuit in which at least one of the two diode elements is damaged due to electrostatic discharge, among the multiple ESD protection circuits;
cutting at least one of the first connection wiring line and the second connection wiring line by illuminating a prescribed portion with a laser beam, in the specified ESD protection circuit; and
connecting the second connection electrode of the first reserve diode structure and the first connection wiring line and connecting the second connection electrode of the second reserve diode structure and the second connection wiring line, by illuminating a portion where the second connection electrode of the first reserve diode structure and the first connection wiring line overlap and a portion where the second connection electrode of the second reserve diode structure and the second connection wiring line overlap, in the specified LSD protection circuit.

* * * * *